US008553740B2

(12) United States Patent
Nishinaka

(10) Patent No.: US 8,553,740 B2
(45) Date of Patent: Oct. 8, 2013

(54) METHOD OF DRIVING GAN-BASED SEMICONDUCTOR LIGHT EMITTING ELEMENT, METHOD OF DRIVING GAN-BASED SEMICONDUCTOR LIGHT EMITTING ELEMENT OF IMAGE DISPLAY DEVICE, METHOD OF DRIVING PLANAR LIGHT SOURCE DEVICE, AND METHOD OF DRIVING LIGHT EMITTING DEVICE

(75) Inventor: Ippei Nishinaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 259 days.

(21) Appl. No.: 12/709,828

(22) Filed: Feb. 22, 2010

(65) Prior Publication Data

US 2010/0226399 A1 Sep. 9, 2010

(30) Foreign Application Priority Data

Mar. 5, 2009 (JP) ................................ P2009-051776

(51) Int. Cl.
*H01S 5/042* (2006.01)
*H01S 5/06* (2006.01)

(52) U.S. Cl.
USPC .................. 372/38.07; 372/38.02; 372/38.04; 345/46; 345/82; 345/204; 345/691

(58) Field of Classification Search
USPC ................ 372/38.02, 38.04, 38.07; 345/204, 345/691, 82, 46
See application file for complete search history.

(56) References Cited

U.S. PATENT DOCUMENTS

| | | | | |
|---|---|---|---|---|
| 7,873,085 | B2 * | 1/2011 | Babushkin et al. | 372/30 |
| 2004/0032888 | A1 * | 2/2004 | Ferstl | 372/38.02 |
| 2007/0284564 | A1 * | 12/2007 | Biwa et al. | 257/13 |
| 2008/0048195 | A1 | 2/2008 | Okuyama et al. | |

FOREIGN PATENT DOCUMENTS

| | | |
|---|---|---|
| JP | HEI 09-181356 | 7/1997 |
| JP | 10-261838 | 9/1998 |
| JP | 2000-228543 | 8/2000 |
| JP | 2001-144332 | 5/2001 |
| JP | 2003-249678 | 9/2003 |
| JP | 2005-216711 | 8/2005 |
| JP | 2006-196490 | 7/2006 |
| JP | 2008-235606 | 10/2008 |
| JP | 2008-263249 | 10/2008 |
| JP | 2008-277865 | 11/2008 |

OTHER PUBLICATIONS

Japanese Office Action issued Feb. 22, 2011, corresponding to Japanese Appln. No. 2009-051776.
Japanese Office Action issued Feb. 14, 2012, for corresponding Japanese Appln. No. 2009-051776.

* cited by examiner

*Primary Examiner* — Jessica Stultz
*Assistant Examiner* — Michael Carter
(74) *Attorney, Agent, or Firm* — K&L Gates, LLP

(57) ABSTRACT

A method of driving a GaN-based semiconductor light emitting element formed by laminating a first GaN-based compound semiconductor layer having a first conductive type, an active layer having a well layer, a second GaN-based compound semiconductor layer having a second conductive type, includes the steps of: starting light emission by the start of the injection of carrier; and then stopping the injection of the carrier before a light emission luminance value becomes constant.

17 Claims, 22 Drawing Sheets

METHOD OF DRIVING GAN-BASED SEMICONDUCTOR LIGHT EMITTING ELEMENT, METHOD OF DRIVING GAN-BASED SEMICONDUCTOR LIGHT EMITTING ELEMENT OF IMAGE DISPLAY DEVICE, METHOD OF DRIVING PLANAR LIGHT SOURCE DEVICE, AND METHOD OF DRIVING LIGHT EMITTING DEVICE

CROSS REFERENCES TO RELATED APPLICATIONS

The present application claims priority to Japanese Priority Patent Application JP 2009-051776 filed in the Japan Patent Office on Mar. 5, 2009, the entire contents of which is hereby incorporated by reference.

BACKGROUND

The present application relates to a method of driving a GaN-based semiconductor light emitting element, a method of driving a GaN-based semiconductor light emitting element of an image display device using the method of driving the GaN-based semiconductor light emitting element, a method of driving a planar light source device, and a method of driving a light emitting device.

A GaN-based semiconductor light emitting element formed of a gallium-nitride (GaN)-based compound semiconductor may realize a light emitting wavelength from an ultraviolet ray to an infrared ray, by controlling band gap energy by a mixed crystal composition or film thickness thereof. In addition, a light emitting diode for emitting blue or green visible light from the ultraviolet ray is commercially available, and is used in wide application such as various display devices, illumination or inspection devices, or disinfection devices. In addition a bluish-violet laser diode is also developed and is used as a pickup for writing or reading of a large capacity optical disk.

However, in the GaN-based semiconductor light emitting element, when carriers are injected, the light emitting wavelength thereof is known to be shifted to a short wavelength side. For example, in a Light Emitting Diode (LED) in which an n-type GaN layer, an active layer formed of InGaN, and a p-type GaN layer are laminated, the lattice constant of InGaN crystal is slightly greater than that of GaN crystal. Accordingly, if the n-type GaN layer in which a top surface is a C plane, the active layer formed of InGaN in which a top surface is a C plane and the p-type GaN layer in which a top surface is a C plane are laminated, piezo spontaneous polarization is produced in a thickness direction of the active layer as the result of applying compression pressure to the active layer. As a result, in particular, if excitation strength is high, the light emitting wavelength from such an LED is shifted to the short wavelength side or a phenomenon such as deterioration of light emitting efficiency, increase of operating voltage, or saturation of luminance is generated.

SUMMARY

In order to prevent piezo spontaneous polarization from being produced in the thickness direction of the active layer, manufacture of a GaN-based semiconductor light emitting element on a nonpolar plane of a substrate is known (for example, JP-A-2006-196490). However, in the GaN-based semiconductor light emitting element manufactured by such a method, the wavelength band for emitting light is limited and light emitting efficiency thereof is also low.

Accordingly, it is desirable to provide a method of driving a GaN-based semiconductor light emitting element, in which the light emitting wavelength is not substantially shifted to the short wavelength side, a method of driving a GaN-based semiconductor light emitting element of an image display device using the method of driving the GaN-based semiconductor light emitting element, a method of driving a planar light source device, and a method of driving a light emitting device.

First to third embodiments of the present application are directed to a method of driving a GaN-based semiconductor light emitting element formed by laminating a first GaN-based compound semiconductor layer having a first conductive type, an active layer having a well layer, a second GaN-based compound semiconductor layer having a second conductive type.

First to third embodiments of the present application are also directed to a method of driving a GaN-based semiconductor light emitting element of an image display device including a GaN-based semiconductor light emitting element for displaying an image, in which the GaN-based semiconductor light emitting element is formed by laminating a first GaN-based compound semiconductor layer having a first conductive type, an active layer having a well layer, a second GaN-based compound semiconductor layer having a second conductive type.

First to third embodiments of the present application are also directed to a method of driving a planar light source device for irradiating light to a transmissive or semi-transmissive liquid crystal display device from a rear surface, in which a GaN-based semiconductor light emitting element as a light source included in the planar light source device is formed by laminating a first GaN-based compound semiconductor layer having a first conductive type, an active layer having a well layer, a second GaN-based compound semiconductor layer having a second conductive type.

First to third embodiments of the present application are also directed to a method of driving a light emitting device including a GaN-based semiconductor light emitting element and a color conversion material which receives light emitted from the GaN-based semiconductor light emitting element and emits light with a wavelength different from a wavelength of the light emitted from the GaN-based semiconductor light emitting element, in which the GaN-based semiconductor light emitting element is formed by laminating a first GaN-based compound semiconductor layer having a first conductive type, an active layer having a well layer, a second GaN-based compound semiconductor layer having a second conductive type.

In the method of driving the GaN-based semiconductor light emitting element according to the first embodiment of the present application, the method of driving the GaN-based semiconductor light emitting element of the image display device according to the first embodiment of the present application, the method of driving the planar light source device according to the first embodiment of the present application or the method of driving the light emitting device according to the first embodiment of the present application (which may hereinafter be collectively referred to as "the driving method according to the first embodiment of the present application"), after light emission is started by the start of the injection of carrier, the injection of the carrier is stopped before the light emission luminance value becomes constant. In the driving method according to the first embodiment of the present application, even after the stoppage of the injection of the carrier, the light emission luminance value may be increased and, after the light emission luminance value becomes a maximum value, the light emission luminance value may be immediately decreased.

In the method of driving the GaN-based semiconductor light emitting element according to the second embodiment of the present application, the method of driving the GaN-based semiconductor light emitting element of the image display device according to the second embodiment of the present application, the method of driving the planar light source device according to the second embodiment of the present application or the method of driving the light emitting device according to the second embodiment of the present application (which may hereinafter be collectively referred to as "the driving method according to the second embodiment of the present application"), after light emission is started by the start of the injection of carrier, the injection of the carrier is stopped before the inclination of the energy band within the active layer due to the injection of the carrier is changed.

In the method of driving the GaN-based semiconductor light emitting element according to the third embodiment of the present application, the method of driving the GaN-based semiconductor light emitting element of the image display device according to the third embodiment of the present application, the method of driving the planar light source device according to the third embodiment of the present application or the method of driving the light emitting device according to the third embodiment of the present application (which may hereinafter be collectively referred to as "the driving method according to the third embodiment of the present application"), after light emission is started by the start of the injection of carrier, the injection of the carrier is stopped before screening within the active layer due to the injection of the carrier occurs.

In the driving method according to the first embodiment of the present application, after light emission is started by the start of the injection of carrier, the injection of the carrier is stopped before the light emission luminance value becomes constant. In the driving method according to the second embodiment of the present application, after light emission is started by the start of the injection of carrier, the injection of the carrier is stopped before the inclination of the energy band within the active layer due to the injection of the carrier is changed. In the driving method according to the third embodiment of the present application, after light emission is started by the start of the injection of carrier, the injection of the carrier is stopped before screening within the active layer due to the injection of the carrier occurs. By stopping the injection of the carrier at these timings, that is, for example, by exciting the GaN-based semiconductor light emitting element by an ultra-short pulse, the light emitting wavelength is not shifted to the short wavelength side even when excitation strength is increased. In addition, it is possible to prevent a phenomenon such as deterioration of light emitting efficiency, increase of operating voltage, or saturation of luminance with certainty. Therefore, a GaN-based semiconductor light emitting element with a high light emitting efficiency may be realized and the GaN-based semiconductor light emitting element may emit light with a longer wavelength with high efficiency, the development of light emitting diodes from yellow to red, which may not be realized in the related art, can be expected.

Additional features and advantages are described herein, and will be apparent from the following Detailed Description and the figures.

DETAILED DESCRIPTION

Figure 1:
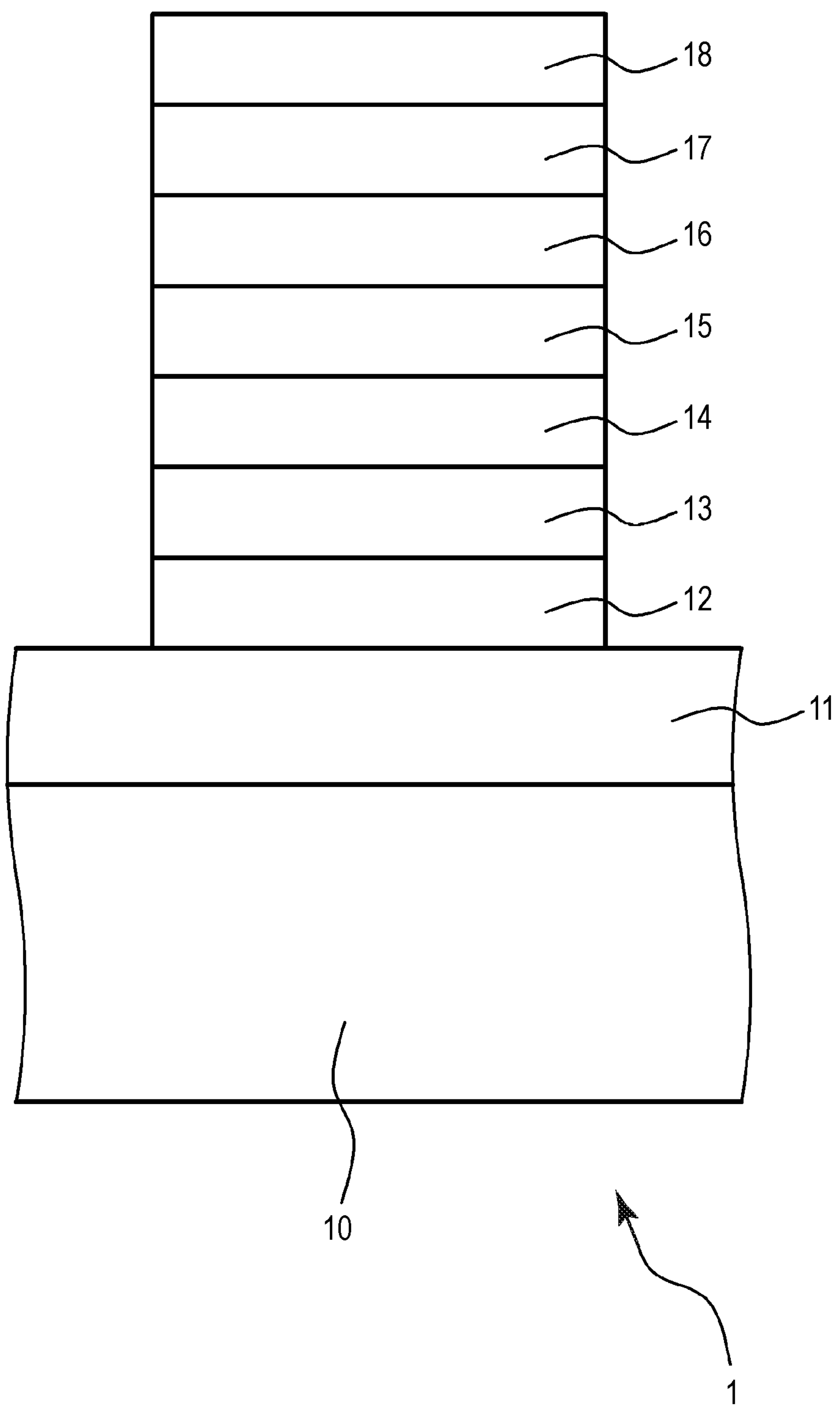
FIG. 1 is a conceptual diagram of a layer configuration of a GaN-based semiconductor light emitting element of Embodiment 1.

The present application will be described with reference to the accompanying drawings according to an embodiment. The present application is not limited to the embodiments, and various numerical values or materials of the embodiments are only exemplary. In addition, description is given in the following order.

1. Overall description of the driving methods according to first to third embodiments of the present application 2. Embodiment 1 (method of driving a GaN-based semiconductor light emitting element according to the first to third embodiments of the present application)

3. Embodiment 2 (which relates to method of driving a light emitting device according to the first to third embodiments of the present application and applies method of driving a GaN-based semiconductor light emitting element of Embodiment 1)

4. Embodiment 3 (which relates to a method of driving a GaN-based semiconductor light emitting element of image display device according to the first to third embodiments of the present application and applies a method of driving GaN-based semiconductor light emitting element of Embodiment 1)

5. Embodiment 4 (modified example of Embodiment 3)

6. Embodiment 5 (which relates to a method of driving a planar light source device according to the first to third embodiments of the present application and applies method of driving GaN-based semiconductor light emitting element of Embodiment 1)

7. Embodiment 6 (modified example of Embodiment 5 and the other)

[General Description of the Driving Methods According to First to Third Embodiments of the Present Application]

In driving methods according to the first to third embodiments of the present application including preferred embodiments thereof (hereinafter, collectively referred to as "driving method of the present application"), a well layer may be formed on an InGaN-based compound semiconductor layer. That is, the well layer may include indium atoms and, more particularly, may include $Al_xGa_{1-x-y}In_yN$($x \geq 0$, $y \geq 0$, $0<x+y \leq 1$). In the driving method of the present application including such a configuration, the time from the start of carrier injection to the stoppage of carrier injection is 10 nanoseconds or less, preferably 1 nanoseconds or less, and more preferably 0.5 nanoseconds or less. In addition, in the driving method of the present application including such a configuration and form, when the amount of the injected carrier is converted into a current amount per 1 $cm^2$ of an active layer, that is, operating current density (or excitation strength) may be 10 $A/cm^2$ or more, preferably 100 $A/cm^2$ or more, and more preferably 300 $A/cm^2$ or more. In addition, in the driving method of the present application including the above-described various configurations and forms, the light emitting wavelength may be equal to or more than 370 nm and equal to or less than 650 nm and preferably equal to or more than 500 nm and equal to or less than 570 nm. In addition, as a first GaN-based compound semiconductor layer and a second GaN-based compound semiconductor layer, there are provided a GaN layer, an AlGaN layer, an InGaN layer and an AlInGaN layer. In addition, boron (B) atoms, thallium (Tl) atoms, arsenic (As) atoms, phosphorus (P) atoms, or antimony (Sb) atoms may be included in these compound semiconductor layers.

In a method of driving a GaN-based semiconductor light emitting element of an image display device according to the first to third embodiments of the present application, as an image display device, for example, there is provided an image display device having the following configuration and structure. In addition, unless special description is made, the number of GaN-based semiconductor light emitting elements configuring the image display device or a light emitting element panel is determined based on the specification of the image display device. A light valve may be further included based on the specification of the image display device.

(1) First-Type Image Display Device

A passive matrix type or active matrix type direct-view image display device which includes (A) a light emitting element panel in which GaN-based semiconductor light emitting elements are arranged in a two-dimensional matrix, and displays an image by controlling light emitting/non-light emitting states of the GaN-based semiconductor light emitting elements and directly viewing the light emitting states of the GaN-based semiconductor light emitting elements.

(2) Second-Type Image Display Device

A passive matrix type or active matrix type projection image display device which includes (A) a light emitting element panel in which GaN-based semiconductor light emitting elements are arranged in a two-dimensional matrix, and displays an image by controlling light emitting/non-light emitting states of the GaN-based semiconductor light emitting elements and performing projection onto a screen.

(3) Third-Type Image Display Device

A (direct-view or projection) color-display image display device which includes (A) a red light emitting element panel in which semiconductor light emitting elements for emitting red light (for example, AlGaInP-based semiconductor light emitting elements or GaN-based semiconductor light emitting elements) are arranged in a two-dimensional matrix, (B) a green light emitting element panel in which GaN-based semiconductor light emitting elements for emitting green light are arranged in a two-dimensional matrix, (C) a blue light emitting element panel in which GaN-based semiconductor light emitting elements for emitting blue light are arranged in a two-dimensional matrix, and (D) a unit (for example, a dichroic prism, and the same is true in the following description) for collecting lights emitted from the red light emitting element panel, the green light emitting element panel and the blue light emitting element panel into one light path, and controls the light emitting/non-light emitting states of the red light emission semiconductor light emitting elements, the green light emission GaN-based semiconductor light emitting elements and the blue light emission GaN-based semiconductor light emitting elements.

(4) Fourth-Type Image Display Device

A (direct-view or projection) image display device which includes (A) GaN-based semiconductor light emitting elements, and (B) a light passing control device (for example, a liquid crystal display device, a Digital Micro-mirror Device (DMD), or a Liquid Crystal On Silicon (LCOS), and the same is true in the following description) which is one kind of light valve for controlling passing/non-passing of lights emitted from the GaN-based semiconductor light emitting elements, and displays an image by controlling the passing/non-passing of the lights emitted from the GaN-based semiconductor light emitting elements by the light passing control device.

In addition, the number of GaN-based semiconductor light emitting elements is determined based on the specification of the image display device and may be one or plural. As a unit (light guide member) for guiding the lights emitted from the GaN-based semiconductor light emitting elements to the light passing control device, a light guide member, a micro lens array, a mirror, a reflection plate, a condenser lens may be exemplified.

(5) Fifth-Type Image Display Device

A (directive-view or projection) image display device which includes (A) a light emitting element panel in which GaN-based semiconductor light emitting elements are arranged in a two-dimensional matrix, and (B) a light passing control device (light valve) for controlling passing/non-passing of lights emitted from the GaN-based semiconductor light emitting elements, and displays an image by controlling the passing/non-passing of the lights emitted from the GaN-based semiconductor light emitting elements by the light passing control device.

(6) Sixth-Type Image Display Device

A (directive-view or projection) color-image image display device which includes (A) a red light emitting element panel in which semiconductor light emitting elements for emitting red light are arranged in a two-dimensional matrix, and a red light passing control device (light valve) for controlling passing/non-passing of light emitted from the red light emitting element panel, (B) a green light emitting element panel in which GaN-based semiconductor light emitting elements for emitting green light are arranged in a two-dimensional matrix, and a green light passing control device (light valve) for controlling passing/non-passing of light emitted from the green light emitting element panel, (C) a blue light emitting element panel in which GaN-based semiconductor light emitting elements for emitting blue light are arranged in a two-dimensional matrix, and a blue light passing control device (light valve) for controlling passing/non-passing of light emitted from the blue light emitting element panel, and (D) a unit configured to collect lights passing through the red light passing control device, the green light passing control device and the blue light passing control device into one light path, and displays an image by controlling the passing/non-passing of the lights emitted from the light emitting element panels by the light passing control devices.

(7) Seventh-Type Image Display Device

A field sequential type (direct-view or projection) color-display image display device which includes (A) semiconductor light emitting elements for emitting red light, (B) GaN-based semiconductor light emitting elements for emitting green light, and (C) GaN-based semiconductor light emitting elements for emitting blue light, (D) a unit configured to collect lights emitted from the semiconductor light emitting elements for emitting red light, the GaN-based semiconductor light emitting elements for emitting green light and the GaN-based semiconductor light emitting elements for emitting blue light into one light path, and (E) a light passing control device (light valve) for controlling passing/non-passing of light emitted from the unit configured to collect the lights into one light path, and displays an image by controlling the passing/non-passing of the lights emitted from the light emitting elements by the light passing control device.

(8) Eighth-Type Image Display Device

A field sequential type (direct-view or projection) color-display image display device which includes (A) a red light emitting element panel in which semiconductor light emitting elements for emitting red light are arranged in a two-dimensional matrix, (B) a green light emitting element panel in which GaN-based semiconductor light emitting elements for emitting green light are arranged in a two-dimensional matrix, and (C) a blue light emitting element panel in which GaN-based semiconductor light emitting elements for emitting blue light are arranged in a two-dimensional matrix, (D) a unit configured to collect lights emitted from the red light emitting element panel, the green light emitting element panel and the blue light emitting element panel into one light path, and (E) a light passing control device (light valve) for controlling passing/non-passing of light emitted from the unit configured to collect the lights into one light path, and displays an image by controlling the passing/non-passing of the lights emitted from the light emitting element panels by the light passing control device.

In an image display device in which light emitting element units, each of which includes a first light emitting element for emitting blue light, a second light emitting element for emitting green light and a third light emitting element for emitting red light and displays a color image, are arranged in a two-dimensional matrix, at least one of the first light emitting element, the second light emitting element and the third light emitting element may be formed of the GaN-based semiconductor light emitting element. As such an image display device, for example, there is an image display device having the following configuration and structure. In addition, the number of light emitting element units is determined based on the specification of the image display device. In addition, the light valve may be further included based on the specification of the image display device.

(9) Ninth-Type Image Display Device

A passive matrix type or active matrix type direct-view color-display image display device which displays an image by controlling the light emitting/non-light emitting states of the first light emitting element, the second light emitting element and the third light emitting element and directly viewing the light emitting states of the light emitting elements.

(10) Tenth-Type Image Display Device

A passive matrix type or active matrix type projection color-display image display device which displays an image by controlling the light emitting/non-light emitting states of the first light emitting element, the second light emitting element and the third light emitting element and performing projection onto a screen.

(11) Eleventh-Type Image Display Device

A field sequential type (direct-view or projection) color-display image display device which includes a light passing control device (light valve) for controlling passing/non-passing of lights emitted from light emitting element units arranged in a two-dimensional matrix, time-divisionally controls the light emitting/non-light emitting states of a first light emitting element, a second light emitting element and a third light emitting element in the light emitting element units, and displays an image by controlling the passing/non-passing of the lights emitted from the first light emitting element, the second light emitting element and the third light emitting element by the light passing control device.

In a planar light source device of a method of driving a planar light source device according to first to third embodiments of the present application, a light source may include a first light emitting element for emitting blue light, a second light emitting element for emitting green light, and a third light emitting element for emitting red light, and a GaN-based semiconductor light emitting element may configure at least one (one kind) of the first light emitting element, the second light emitting element and the third light emitting element. In other words, one of the first light emitting element, the second light emitting element and the third light emitting element may be composed of a kind of the GaN-based semiconductor light emitting element and the remaining two light emitting elements may be composed of a semiconductor light emitting element having another configuration, any two of the first light emitting element, the second light emitting element and the third light emitting element may be composed of the GaN-based semiconductor light emitting element and the remaining one light emitting element may be composed of a semiconductor light emitting element having another configuration, or all the first light emitting element, the second light emitting element and the third light emitting element may be composed of the GaN-based semiconductor light emitting element. As the semiconductor light emitting element having another configuration, there is an AlGaInP-based semiconductor light emitting element for emitting red light. The present application is not limited thereto and the light source of the planar light source device may be composed of one or a plurality of light emitting devices. The number of each of the first light emitting element, the second light emitting element and the third light emitting element may be one or plural.

The planar light source device may be two types of planar light source devices (backlights), that is, for example, a down light type planar light source device disclosed in JP-UM-A-63-187120 or JP-A-2002-277870 and, for example, a edge light type (also called side light type) planar light source disclosed in JP-A-2002-131552. In addition, the number of GaN-based semiconductor light emitting elements is substantially arbitrary and is determined based on the specification of the planar light source device.

In the down light type planar light source device, a first light emitting element, a second light emitting element and a third light emitting element are arranged so as to face a liquid crystal display device, and a diffusion plate, an optical function sheet group such as a diffusion sheet, a prism sheet, a polarization conversion sheet, or a reflection sheet is arranged between the liquid crystal display device and the first light emitting element, the second light emitting element and the third light emitting element.

In the down light type planar light source device, more particular, a semiconductor light emitting element for emitting red light (for example, with a wavelength of 640 nm), a GaN-based semiconductor light emitting element for emitting green light (for example, with a wavelength of 530 nm) and a GaN-based semiconductor light emitting element for blue light (for example, with a wavelength of 450 nm) may be disposed and arranged in a casing and the present application is not limited thereto. If a plurality of semiconductor light emitting elements for emitting red light, a plurality of GaN-based semiconductor light emitting elements for emitting green light and a plurality of GaN-based semiconductor light emitting elements for emitting blue light are disposed and arranged in a casing, as the arrangement state of these light emitting elements, a plurality of light emitting element rows each having a set of a red light emission semiconductor light emitting element, a green light emission GaN-based semiconductor light emitting element and a blue light emission GaN-based semiconductor light emitting element may be arranged in a horizontal direction of a screen of a liquid crystal display device so as to form a light emitting element row array, and a plurality of light emitting element row arrays may be arranged in a vertical direction of the screen of the liquid crystal display device. In addition, as the light emitting element row, there are a plurality of combinations of (one red light emission semiconductor light emitting element, one green light emission GaN-based semiconductor light emitting element and one blue light emission GaN-based semiconductor light emitting element), (one red light emission semiconductor light emitting element, two green light emission GaN-based semiconductor light emitting elements and one blue light emission GaN-based semiconductor light emitting element), (two red light emission semiconductor light emitting elements, two green light emission GaN-based semiconductor light emitting elements and one blue light emission GaN-based semiconductor light emitting element), or the like. In addition, a light emitting element for emitting light of a fourth color other than red, green and blue may be further included. In addition, in the GaN-based semiconductor light emitting element, for example, a light pickup lens described in NIKKEI ELECTRONICS, Dec. 20, 2004, No. 889, page 128 may be mounted.

Meanwhile, in the edge light type planar light source device, a light guide plate is disposed so as to face a liquid crystal display device and a GaN-based semiconductor light emitting element is disposed on a side surface (a first side surface which will be next described) of the light guide plate. The light guide plate has a first surface (bottom surface), a second surface (top surface) facing the first surface, a first side surface, a second side surface, a third side surface facing the first side surface, and a fourth side surface facing the second side surface. The more detailed shape of the light guide plate, there is a wedge-shaped truncated quadrangular prismatic shape as a whole. In this case, two facing side surfaces of a truncated quadrangular prism correspond to the first surface and the second surface and the bottom surface of the truncated quadrangular prism corresponds to the first side surface. Convex portions and/or concave portions are preferably provided in a surface portion of the first surface (bottom surface). Light is incident to the first side surface of the light guide plate and light is emitted from the second surface (top surface) toward the liquid crystal display device. The second surface of the light guide plate may be smooth (that is, a mirror surface) or may have blast embossment having a diffusion effect (that is, minute irregularities).

The convex portions and/or the concave portions are preferably provided in the first surface (bottom surface) of the light guide plate. That is, the convex portions, the concave portions or irregularities are preferably provided in the first surface of the light guide plate. If the irregularities are provided, concave portions and convex portions are continuously or discontinuously provided. The convex portion and/or the concave portion provided in the first surface of the light guide plate may be continuous convex portions and/or concave portions extending along a direction forming a predetermined angle with a light incident direction to the light guide plate. In such a configuration, as the section shape of the continuous convex shape or concave shape when cutting the light guide plate in a virtual plane orthogonal to the first surface as the light incident direction to the light guide plate, a triangle; any quadangle such as a square, a rectangle, a trapezoid; any polygon; any smooth curve including a circle, an ellipse, a parabola, a hyperbola, and a catenary; or the like may be exemplified. In addition, a direction forming a predetermined angle with the light incident direction to the light guide plate indicates a direction of 60 degrees to 120 degrees when the light incident direction to the light guide plate is 0 degree. The same is true in the following description. Alternatively, the convex portions and/or the concave portions provided in the first surface of the light guide plate may be discontinuous convex portions and/or concave portions extending along a direction forming a predetermined angle with the light incident direction to the light guide plate. In such a configuration, as the section shape of the discontinuous convex shape or concave shape, a polygonal column including a pyramid, a circular cone, a cylindrical column, a triangular prism, a rectangular prism; a smooth curve such as a portion of a sphere, a portion of a spheroid, a portion of a rotary paraboloid, or a portion of a rotary hyperboloid may be exemplified. In the light guide plate, if necessary, the convex portions or the concave portions may not be formed in the peripheral portion of the first surface. In addition, light emitted from the light source and incident to the light guide plate is scattered by collision with the convex portions or the concave portions formed in the first surface of the light guide plate, but the height, the depth, the pitch or the shape of the convex portions or the convex portions provided in the first surface of the light guide plate may be constant or changed as it is separated from the light source. In the latter case, for example, the pitch of the convex portions or the concave portions may become smaller as it is separated from the light source. The pitch of the convex portion or the pitch of the concave portion indicates the pitch of the convex portion or the pitch of the concave portion according to the light incident direction to the light guide plate.

In the planar light source device including the light guide plate, a reflection member is preferably disposed so as to face the first surface of the light guide plate. A liquid crystal display device is disposed so as to face the second surface of the light guide plate. The light emitted from the light source is incident from the first side surface of the light guide plate (for example, the surface corresponding to the bottom surface of the truncated quadrangular prism) to the light guide plate, is scattered by collision with the convex portions or the concave portions of the first surface, is emitted from the first surface, is reflected from the reflection member, is incident to the first surface again, is emitted from the second surface, and is irradiated to the liquid crystal display device. For example, a diffusion sheet or a prism sheet may be disposed between the liquid crystal display device and the second surface of the light guide plate. Alternatively, the light emitted from the light source may be directly guided to the light guide plate or may be indirectly guided to the light guide plate. In the latter case, for example, an optical fiber is used.

The light guide plate is preferably made of a material which does not substantially absorb light emitted from the light source. In detail, as a material constituting the light guide plate, for example, there is glass or a plastic material (for example, PMMA, polycarbonate resin, acrylic resin, amorphous polyprophylene-based resin, styrene-based resin including AS resin).

For example, a transmissive color liquid crystal device includes, for example, a front panel including a first transparent electrode, a rear panel including a second transparent electrode, and a liquid crystal material disposed between the front panel and the rear panel.

More specially, the front panel includes, for example, a first substrate formed of a glass substrate or a silicon substrate, a first transparent electrode (which is also called a common electrode and is formed of, for example, ITO) provided on an inner surface of the first substrate, and a polarization film provided on an outer surface of the first substrate. In addition, the front panel has a configuration in which a color filter covered by an overcoat layer formed of acrylic resin or epoxy resin is provided on the inner surface of the first substrate and the first transparent electrode is formed on the overcoat layer. An alignment film is formed on the first transparent electrode. As an arrangement pattern of the color filter, there is a delta arrangement, a stripe arrangement, a diagonal arrangement or a rectangular arrangement. Meanwhile, the rear panel includes a second substrate formed of a glass substrate or a silicon substrate, a switching element formed on an inner surface of the second substrate, a second transparent electrode (which is also called a pixel electrode and is formed of, for example, ITO), a conductive/non-conductive state of which is controlled by the switching element, and a polarization film provided on an outer surface of the second substrate. An alignment film is formed on the entire surface including the second transparent electrode. Various members or liquid crystal materials constituting the transmissive color liquid crystal display device may be formed of known members and materials. In addition, as the switching element, a three-terminal element, such as an MOS type FET or a Thin Film Transistor (TFT), or a two-terminal element such as an MIM element, a varistor element or a diode, which is formed on a single crystal silicon semiconductor substrate, may be exemplified.

In a method of driving a light emitting device according to first to third embodiments of the present application, as light emitted from the GaN-based semiconductor light emitting element, there is visible light, ultraviolet ray, or a combination of visible light and ultraviolet ray. In addition, in the light emitting device, the light emitted from the GaN-based semiconductor light emitting element may be blue light, and the light emitted from a color conversion material may be at least one selected from the group consisting of yellow light, green light and red light. As a color conversion material which is excited by the blue light emitted from the GaN-based semiconductor light emitting element so as to emit red light, there is specially a red light emission phosphor particle and, more specially, (ME:Eu) S ("ME" denotes at least one atom selected from the group consisting of Ca, Sr and Ba, and the same is true in the following description), $(M:Sm)_x(Si, Al)_{12}(O, N)_{16}$ ("M" denotes at least one atom selected from the group consisting of Li, Mg and Ca, and the same is true in the following description), or $ME_2Si_5N_8$:Eu, (Ca:Eu)$SiN_2$, (Ca:Eu)$AlSiN_3$. As a color conversion material which is excited by the blue light emitted from the GaN-based semiconductor light emitting element so as to emit green light, there is specially a green light emission phosphor particle and, more specially, (ME:Eu) $Ga_2S_4$, $(M:RE)_x(Si, Al)_{12}(O, N)_{16}$ ("RE" denotes Tb and Yb), $(M:Tb)_x(Si, Al)_{12}(O, N)_{16}$, $(M:Yb)_x(Si, Al)_{12}(O, N)_{16}$, or $Si_{6-Z}Al_ZO_ZN_{8-Z}$:Eu. In addition, as a color conversion material which is excited by the blue light emitted from the GaN-based semiconductor light emitting element so as to emit yellow light, there is specially a yellow light emission phosphor particle and, more specially, a YAG (yttrium-aluminum-garnet)-based phosphor particle. In addition, one color conversion material may be used or a mixture of two or more color conversion materials may be used. In addition, by using a mixture of two or more color conversion materials, light of a color other than yellow, green and red may be emitted from a color conversion material mixing product. In detail, for example, cyan light may be emitted. In this case, a mixture of a green light emission phosphor particle (for example, $LaPO_4$:Ce, Tb, $BaMgAl_{10}O_{17}$:Eu, Mn, $Zn_2SiO_4$:Mn, $MgAl_{11}O_{19}$:Ce, Tb, $Y_2SiO_5$:Ce, Tb, $MgAl_{11}O_{19}$:CE, Tb, Mn) and a blue light emission phosphor particle (for example, $BaMgAl_{10}O_{17}$:Eu, $BaMg_2Al_{16}O_{27}$:Eu, $Sr_2P_2O_7$:Eu, $Sr_5(PO_4)_3Cl$:Eu, (Sr, Ca, Ba, Mg)$_5(PO_4)_3$Cl:Eu, $CaWO_4$, $CaWO_4$:Pb) may be used.

If the light emitted from the GaN-based semiconductor light emitting element is ultraviolet ray, as a color conversion material which is excited by the ultraviolet ray which is light emitted from the GaN-based semiconductor light emitting element so as to emit red light, there is, in detail, a red light emission phosphor particle and, more specially, $Y_2O_3$:Eu, $YVO_4$:Eu, Y(P, V)$O_4$:Eu, 3.5 MgO.0.5 $MgF_2.Ge_2$:Mn, $CaSiO_3$:Pb, Mn, $Mg_6AsO_{11}$:Mn, (Sr, Mg)$_3(PO_4)_3$:Sn, $La_2O_2S$:Eu, or $Y_2O_2S$:Eu. In addition, as a color conversion material which is excited by the ultraviolet ray which is light emitted from the GaN-based semiconductor light emitting element so as to emit green light, there is specially a green light emission phosphor particle and, more specially, $LaPO_4$:Ce, Tb, $BaMgAl_{10}O_{17}$:Eu, Mn, $Zn_2SiO_4$:Mn, $MgAl_{11}O_{19}$:Ce, Tb, $Y_2SiO_5$:Ce, Tb, $MgAl_{11}O_{19}$:CE, Tb, Mn, or $Si_{6-Z}Al_ZO_ZN_{8-Z}$:Eu. In addition, as a color conversion material which is excited by the ultraviolet ray which is light emitted from the GaN-based semiconductor light emitting element so as to emit blue light, there is specially a blue light emission phosphor particle and, more specially, $BaMgAl_{10}O_{17}$:Eu, $BaMg_2Al_{16}O_{27}$:Eu, $Sr_2P_2O_7$:Eu, $Sr_5(PO_4)_3Cl$:Eu, (Sr, Ca, Ba, Mg)$_5(PO_4)_3$Cl:Eu, $CaWO_4$, or $CaWO_4$:Pb. In addition, as a color conversion material which is excited by the ultraviolet ray which is light emitted from the GaN-based semiconductor light emitting element so as to emit yellow light, there is specially a yellow light emission phosphor particle and, more specially, a YAG-based phosphor particle. In addition, one color conversion material may be used or a mixture of two or more color conversion materials may be used. In addition, by using a mixture of two or more color conversion materials, light of a color other than yellow, green and red may be emitted from a color conversion material mixing product. In detail, for example, cyan light may be emitted. In this case, a mixture of a green light emission phosphor particle and a blue light emission phosphor particle may be used.

The color conversion material is not limited to a phosphor particle and, for example, CdSe/ZnS having a nanometer size or a multicolor/high-efficiency light emission particle using a quantum effect, such as silicon having a nanometer size may be used. It is known that a rare earth atom added to a semiconductor material sharply emits light by intra-shell transitions and a light emitting particle using such a technology may be used.

In the light emitting device, light emitted from the GaN-based semiconductor light emitting element and light emitted from the color conversion material (for example, yellow; red and green; yellow and red; green, yellow and red) may be mixed so as to emit white light, but the present application is not limited thereto, a variable color illumination or a display application is possible.

In the present application including the above-described embodiments and configurations, a short side (if a plane shape of the active layer is rectangular) or a small diameter (if a plane shape of the active layer is circular or elliptical) of the active layer is not limited, but may be 0.1 mm or less, preferably 0.03 mm or less, and more preferably 0.02 mm or less. If the plane shape of the active layer has a shape which may not be defined by the short side or the small diameter, such as a polygon, when a circle having the same area as the area of the active layer is considered, the diameter of the circle is defined as a "small diameter". In the GaN-based semiconductor light emitting element of the present application, in particular, the shift of the light emitting wavelength with high operating current density is reduced, but, in the GaN-based semiconductor light emitting element having a smaller size, the reduction effect of the shift of the light emitting wavelength is remarkable. Accordingly, by applying the driving method of the present application to the GaN-based semiconductor light emitting element having a smaller size than that of the GaN-based semiconductor light emitting element of the related art, for example, it is possible to realize an image display device using a low-cost high-density (high-precision) GaN-based semiconductor light emitting element.

For example, if a general 32-inch high-definition television receiver (1920×1080×RGB) is realized by arranging GaN-based semiconductor light emitting elements in a matrix in a household television receiver, the size of one pixel which is a combination of a red light emitting element, a green light emitting element and a blue light emitting element corresponding to sub pixels is generally 360 μm square and each sub pixel has a long side of 300 μm and a short side of 100 μm or less. Alternatively, for example, in a projection display which performs projection using a lens by arranging the GaN-based semiconductor light emitting elements in a matrix, similar to a liquid crystal display device or a DMD light valve of a projection display of the related art, a size of 1 inch or less is preferable in terms of an optical design or cost. Even in a triple plate using a dichroic prism or the like, in order to realize general resolution of 720×480 of a DVD having a diagonal size of 1 inch, the size of the GaN-based semiconductor light emitting element is 30 μm or less. Even when the short side (small diameter) is 0.1 mm or less and more preferably the short side (small diameter) is 0.03 mm or less, the shift of the light emitting wavelength of such a dimension range may be remarkably reduced compared with the method of driving the GaN-based semiconductor light emitting element of the related art and an application range is practically widened and useful.

In the present application including the above-described embodiments and configurations, as a method of forming various GaN-based compound semiconductor layers such as a first GaN-based compound semiconductor layer, an active layer, a second GaN-based compound semiconductor layer, there is a Metal Organic Chemical Vapor Deposition (MOCVD) method, a MBE method, a hydride vapor phase growth method in which halogen contributes to transport or reaction, or the like.

As an organic gallium source gas of the MOCVD method, there is trimethyl gallium (TMG) gas or triethyl gallium (TEG) gas and, as nitrogen source gas, there is ammonia gas or hydrazine gas. In addition, in the formation of a GaN-based compound semiconductor layer having an n-type conductive type, for example, silicon (Si) is added as n-type impurities (n-type dopants) and, in the formation of a GaN-based compound semiconductor layer having a p-type conductive type, for example, magnesium (Mg) is added as p-type impurities (p-type dopants). In addition, if aluminum (Al) or indium (In)

is contained as constituting atoms of the GaN-based compound semiconductor layer, trimethyl aluminum (TMA) gas is used as an Al source and trimethyl indium (TMI) gas is used as an In source. In addition, monosilane ($SiH_4$) gas is used as an Si source and cyclopentadienylmagnesium gas or methlycyclopentadienyl magnesium or biscyclopentadienyl magnesium ($Cp_2Mg$) is used as an Mg source. In addition, as the n-type impurities (n-type dopants), in addition to Si, there is Ge, Se, Sn, C or Ti, and, as the p-type impurities (p-type dopants), in addition to Mg, there is Zn, Cd, Be, Ca, Ba or O.

A p-side electrode connected to a GaN-based compound semiconductor layer having a p-type conductive type preferably has a single-layer configuration or a multi-layer configuration including at least one selected from the group consisting of palladium (Pd), Platinum (Pt), nickel (Ni), Aluminum (Al), titanium (Ti), gold (Au) and silver (Ag). Alternatively, a transparent conductive material such as Indium Tin Oxide (ITO) may be used. Among them, silver (Ag) which may reflect light with high efficiency or Ag/Ni, or Ag/Ni/Pt may be preferably used. Meanwhile, an n-side electrode connected to a GaN-based compound semiconductor layer having an n-type conductive type preferably has a single-layer configuration or a multi-layer configuration including at least one selected from the group consisting gold (Au), silver (Ag), palladium (Pd), aluminum (Al), titanium (Ti), tungsten (W), copper (Cu), Zinc (Zn), tin (Sn) and indium (In) and, for example, Ti/Au, Ti/Al, Ti/Pt/Au may be exemplified. The n-side electrode or the p-side electrode may be formed of, for example, a PVD method such as a vacuum deposition method or a sputtering method.

In order to electrically connect an external electrode or circuit on the n-side electrode or the p-side electrode, a pad electrode may be provided. The pad electrode has a single-layer configuration or a multi-layer configuration including at least one selected from the group consisting of titanium (Ti), aluminum (Al), platinum (Pt), gold (Au) and nickel (Ni). Alternatively, the pad electrode may have a multi-layer configuration of Ti/Pt/Au or a multi-layer configuration of Ti/Au.

In the present application including the above-described embodiments and configurations, an assembly of the GaN-based semiconductor light emitting elements may have a face-up structure or a flip-chip structure.

As the GaN-based semiconductor light emitting element, more specially, a Light Emitting Diode (LED) or a Semiconductor Laser (LD) may be exemplified. In addition, if the lamination structure of the GaN-based compound semiconductor layer has a LED structure or a laser structure, the structure and the configuration are not specially limited. As the application field of the GaN-based semiconductor light emitting element, in addition to the above-described light emitting device, the image display device, the planar light source device, and the liquid crystal display device assembly including the color liquid crystal display assembly, there is a lamp fitting or a lamp (for example, a headlight, a taillight, a high mount stop light, a small light, a turn signal lamp, a fog light, an interior lamp, a meter panel light, a light source mounted in various button, a destination display lamp, an emergency lamp, or an emergency guide lamp) of a transportation device such as a vehicle, an electrical train, a ship, an aircraft, a lamp fitting or a lamp (an outdoor light, an interior light, a lighting fitting, an emergency lamp, an emergency guide lamp and the like) of a building, a street light, various display light fittings of a signal device, an advertising display, a machine, a device or the like, a lamp or lighting system of a tunnel, an underground passage or the like, a special light of various inspection devices such as a biological microscope, or the like, a sterilization device using light, an odor eliminating/sterilization device combined with photocatalyst, an exposure device of a photo or a semiconductor lithography, or a device for modulating light and delivering information via a space, an optical fiber, or a light guide.

Embodiment 1

Figure 2:
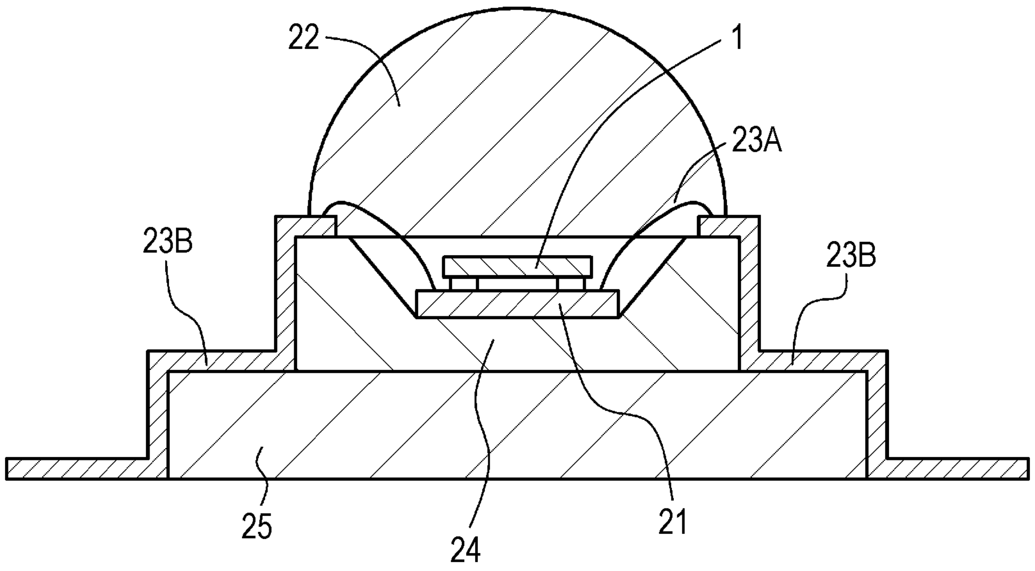
FIG. 2 is a schematic cross-sectional view of the GaN-based semiconductor light emitting element of Embodiment 1.

Embodiment 1 relates to a method of driving a GaN-based semiconductor light emitting element according to first to third embodiments of the present application. The method of driving the GaN-based semiconductor light emitting element of Embodiment 1 is a method of driving a GaN-based semiconductor light emitting element (of which a conceptual diagram of a layer configuration is shown in FIG. 1 and a schematic cross-sectional view is shown in FIG. 2) formed by laminating (A) a first GaN-based compound semiconductor layer 13 having a first conductive type (in detail, an n-type conductive type), (B) an active layer 15 having a multiple quantum well structure including well layers and a barrier layer partitioning the well layer and the well layer, and (C) a second GaN-based compound semiconductor layer 17 having a second conductive type (in detail, a p-type conductive type).

In addition, in the method of driving of the GaN-based light emitting element of Embodiment 1, based on the driving method according to the first embodiment of the present application, after light emission is started by the start of the injection of the carrier, the injection of the carrier is stopped before a light emission luminance value becomes constant. Even after the injection of the carrier is stopped, the light emission luminance value is increased, and, after the light emission luminance value becomes a maximum value, the light emission luminance value is immediately decreased.

Based on the driving method according to the second embodiment of the present application, after light emission is started by the start of the injection of the carrier, the injection of the carrier is stopped before the inclination of the energy band within the active layer due to the injection of the carrier is changed.

In addition, based on the driving method according to the third embodiment of the present application, after light emission is started by the start of the injection of the carrier, the injection of the carrier is stopped before screening within the active layer due to the injection of the carrier occurs.

In the GaN-based semiconductor light emitting element 1 of Embodiment 1, and, more specially, a Light Emitting Diode (LED), the well layer configuring the active layer 15 is formed of an InGaN-based compound semiconductor layer. The composition of the well layer having nine layers (the thickness of one layer is 3 nm) is specially $Al_xGa_{1-x-y}In_yN$ ($x \geq 0$, $y > 0$, $0 < x+y \leq 1$) and, more specially, $Ga_{0.77}In_{0.23}N$, and the barrier layer having eight layers (the thickness of one layer is 15 nm) is specially GaN. In addition, a time from the start of the injection of the carrier to the stoppage of the injection of the carrier is 10 nanoseconds or less and specially 5 nanoseconds. In addition, the amount of the injected carrier is, for example, 300 $A/cm^2$ when being converted into a current amount per 1 $cm^2$ of the active layer. In addition, the light emitting wavelength is equal to or more than 500 nm and equal to or less than 570 nm and, more specially, 520 nm to 525 nm. The thickness of one layer of the barrier layer may be 15 nm to 40 nm.

The first GaN-based compound semiconductor layer 13 is composed of a GaN layer (thickness: 3 μm) in which Si is doped by about $5\times10^{18}/cm^3$ and is formed on an undoped GaN layer (thickness: 1 μm) 12. In addition, a buffer layer 11 (thickness: 30 nm) is formed on a substrate 10 formed of sapphire and an undoped GaN layer 12 is formed on the buffer layer 11. An undoped GaN layer (thickness: 5 nm) 14 is formed between the first GaN-based compound semiconductor layer 13 and the active layer 15. In addition, the second GaN-based compound semiconductor layer 17 is composed of an $Al_{0.15}Ga_{0.85}N$ layer (thickness: 20 nm) in which Mg is doped by about $5\times10^{19}/cm^3$ and an undoped GaN layer (thickness: 10 nm) 16 is formed between the second GaN-based compound semiconductor layer 17 and the active layer 15. In addition, a GaN layer (thickness: 100 nm) 18 in which Mg is doped by about $5\times10^{19}/cm^3$ and is formed on the second GaN-based compound semiconductor layer 17. The undoped GaN layer 14 is provided in order to improve crystallinity of the active layer 15 is crystal-grown and the undoped GaN layer 16 is provided in order to prevent the dopant (for example, Mg) of the second GaN-based compound semiconductor layer 17 from being diffused into the active layer 15. A p-side electrode (not shown) connected to the second GaN-based compound semiconductor layer 17 having a p-type conductive type is formed of Ag/Ni and an n-side electrode (not shown) connected to the first GaN-based compound semiconductor layer 13 having an n-type conductive type is formed of Ti/Al.

Hereinafter, the outline of a method of manufacturing the GaN-based semiconductor light emitting element 1 of Embodiment 1 will be described.

[Process-100]

First, sapphire having a C plane is used as a substrate 10 and the substrate is cleaned in carrier gas formed of hydrogen at a substrate temperature of 1050° C. for 10 minutes and the substrate temperature is decreased to 500° C. In addition, based on an MOCVD method, while supplying ammonia gas which is a raw material of nitrogen, trimethygallium (TMG) gas which is a raw material of gallium is supplied so as to crystal-grow a buffer layer 11 having a thickness of 30 nm and formed of low-temperature GaN on the substrate 10, and the supply of the TMG gas is then stopped.

[Process-110]

Next, after the substrate temperature is increased to 1020° C., the supply of the TMG gas is started so as to crystal-grow an undoped GaN layer 12 having a thickness of 1 μn on the buffer layer 11. Subsequently, the supply of monosilane ($SiH_4$) gas which is a raw material of silicon is started such that a first GaN-based compound semiconductor layer 13 formed of Si-doped GaN (GaN: Si) and having an n-type conductive type and a thickness of 3 μn is crystal-grown on the undoped GaN layer 12. In addition, a doping concentration is about $5\times10^{18}/cm^3$.

[Process-120]

Thereafter, the supply of the TMG gas and the $SiH_4$ gas is stopped, the carrier gas is switched from hydrogen gas to nitrogen gas, and the substrate temperature is decreased to 750° C. By supplying triethylgallium (TEG) gas as a raw material of Ga and trimethylindium (TMI) gas as a raw material of In by switching a valve, an undoped GaN layer 14 having a thickness of 5 nm is crystal-grown and, substantially, an active layer 15 having a multiple quantum well structure including a well layer formed of InGaN which is undoped and has an n-type impurity concentration of less than $2\times10^{17}/cm^3$ and a barrier layer formed of GaN which is undoped or has an n-type impurity concentration of less than $2\times10^{17}/cm^3$ is formed. In addition, in an In composition ratio of the well layer is, for example. 0.23. The In composition ratio of the well layer is determined based on a desired light emitting wavelength.

[Process-130]

After the formation of the multiple quantum well structure is completed, subsequently, the substrate temperature is increased to 800° C. while growing an undoped GaN layer 16 having a thickness of 10 nm, and the supply of trimethylaluminium (TMA) gas as a raw material of Al and biscyclopentadienyl magnesium ($Cp_2Mg$) gas as a raw material of Mg is started so as to crystal grow a second GaN-based compound semiconductor layer 17 formed of AlGaN (AlGaN:Mg) having a Mg-doped Al composition ratio of 0.15 and having a p-type conductive type and a thickness of 20 nm. In addition, a doping concentration is about $5\times10^{19}/cm^3$.

[Process-140]

Thereafter, the supply of the TEG gas, the TMA gas and the $Cp_2Mg$ gas is stopped, the carrier gas is switched from nitrogen to hydrogen, the substrate temperature is increased to 850° C., and the supply of the TMG gas and the $Cp_2Mg$ gas is started such that an Mg-doped GaN layer (GaN:Mg) 18 having a thickness of 100 nm is crystal-grown on the second GaN-based compound semiconductor layer 17. In addition, a doping concentration is about $5\times10^{19}/cm^3$. Thereafter, the supply of the TMG gas and the $Cp_2Mg$ gas is stopped, the substrate temperature is decreased, the supply of the ammonia gas is stopped at the substrate temperature of 600° C., and the substrate temperature is decreased to a room temperature, thereby completing crystal growth.

The substrate temperature $T_{MAX}$ after the growth of the active layer 15 satisfies $T_{MAX}$<1350-0.75λ(° C.), and preferably $T_{MAX}$<1250-0.75λ(° C.), when the light emitting wavelength is λ nm. By employing the substrate temperature $T_{MAX}$ after the growth of the active layer 15, the thermal deterioration of the active layer 15 may be suppressed as described in JP-A-2002-319702.

After crystal growth is completed, the substrate is subjected to an annealing process in a nitrogen gas atmosphere at 800° C. for 10 minutes so as to activate the p-type impurity (p-type dopant).

[Process-150]

Thereafter, similar to a wafer process and a chipping process of a general LED, a photolithography process, an etching process or a process of forming a p-side electrode and an n-side electrode by metal deposition is performed, a chipping process is performed by dicing, resin molding and packing are performed, thereby manufacturing various shell-shaped or surface-mounting LEDs.

The schematic cross-sectional view of the GaN-based light emitting element of Embodiment 1 obtained by the above-described processes is shown in FIG. 2. The GaN-based semiconductor light emitting element 1 is specially fixed to a sub mount 21 such that the GaN-based semiconductor light emitting element 1 is electrically connected to an external electrode 23B via a wire (not shown) and a gold wire 23A provided on the sub mount 21, and the external electrode 23B is electrically connected to a driving circuit (not shown). The sub mount 21 is mounted in a reflector cup 24 and the reflector cup 24 is mounted in a heat sink 25. In addition, a plastic lens 22 is disposed above the GaN-based semiconductor light emitting element 1, and a light transmission medium layer (not shown) including, for example, epoxy resin (refractive index: for example 1.5), a gel material [for example, a product name OCK-451 (refractive index: 1.51), a product name OCK-433 (refractive index: 1.46) of Nye Corporation], silicon rubber, an oil compound material such as silicon oil compound [for example, a product name TSK5353 (refractive index: 1.45) of Toshiba Silicone Co., Ltd.] which is transparent with respect to light emitted from the GaN-based semiconductor light emitting element 1 is filled between the plastic lens 22 and the GaN-based semiconductor light emitting element 1.

Figure 23:
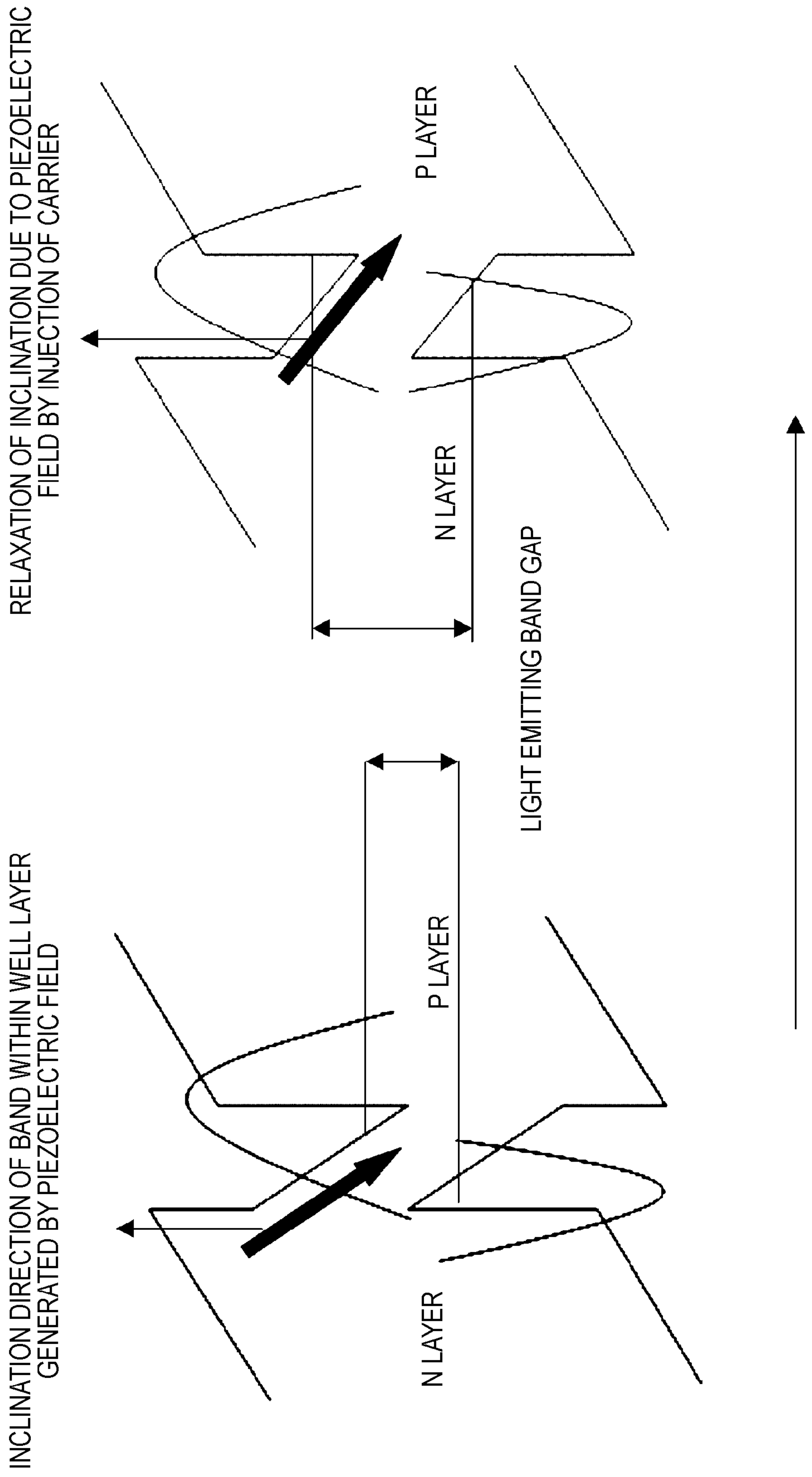
FIG. 23 is a conceptual diagram illustrating increase in band gap based on a piezoelectric field generated when a well layer formed of an InGaN layer is provided in a barrier layer formed of a GaN layer, in a GaN-based semiconductor light emitting element.

In such a GaN-based semiconductor light emitting element 1, when the well layer formed of an InGaN layer is provided in the barrier layer formed of a GaN layer, distortion occurs in the well layer due to a difference in lattice constant of crystal constituting these layers and a piezoelectric field is generated in a direction of the active layer due to stress. Although a conceptual diagram is shown in FIG. 23, the shift of the light emitting wavelength to the short wavelength side occurs by injecting the carrier such that the inclination of the energy band in the well layer is relaxed by the piezoelectric field and screening occurs so as to increase a band gap.

Figure 4:
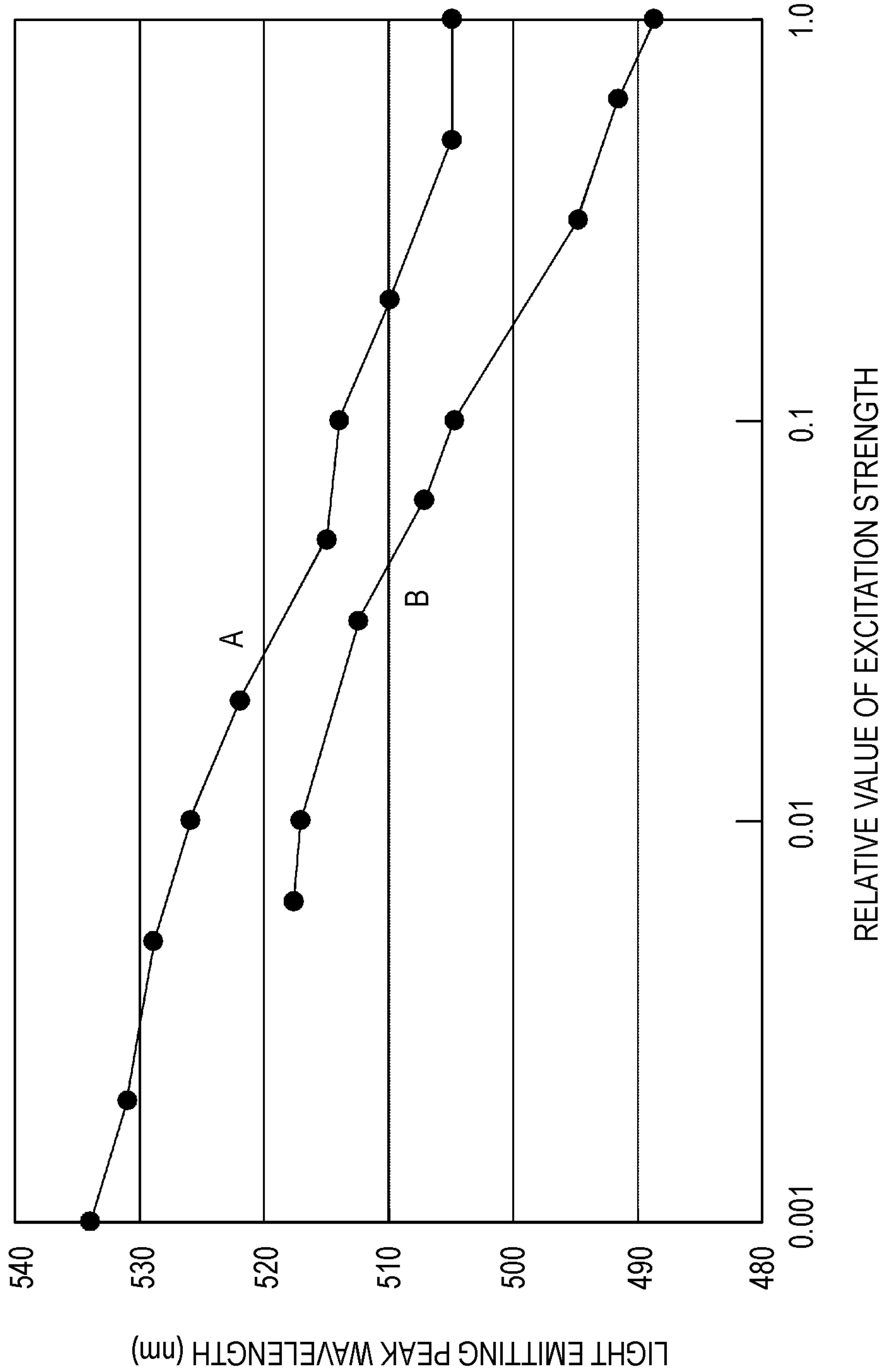
FIG. 4 is a graph showing a result of measuring a light emitting wavelength of a lamination structure in a reference example in which continuous oscillation laser light is irradiated to the lamination structure of the GaN-based compound semiconductor layer obtained in Embodiment 1 so as to perform laser excitation.

A result of measuring the light emitting wavelength of the lamination structure when continuous oscillation laser light is irradiated to the lamination structure the first GaN-based compound semiconductor layer 13, the active layer 15 and the second GaN-based compound semiconductor layer 17 obtained up to the process 140 so as to perform laser excitation is shown in FIG. 4 as a reference example. Although two pieces of data “A” and “B” are shown in FIG. 4, in the data, if the relative value of the excitation strength is increased by two digits, it may be seen that the light emitting wavelength of the lamination structure is generally changed by 20 nm. When the continuous oscillation laser light is irradiated to the lamination structure, phenomenally, light emission is started by the start of the injection of the carrier and the carrier is continuously injected even after the light emission luminance value becomes constant. Alternatively, light emission is started by the start of the injection of the carrier and the carrier is continuously injected even after the inclination of the energy band in the active layer due to the injection of the carrier is changed. Alternatively, light emission is started by the start of the injection of the carrier and the carrier is continuously injected even after screening occurs in the active layer due to the injection of the carrier. As a result, if the excitation strength is changed, the light emitting wavelength of the lamination structure is significantly changed.

Figure 3:
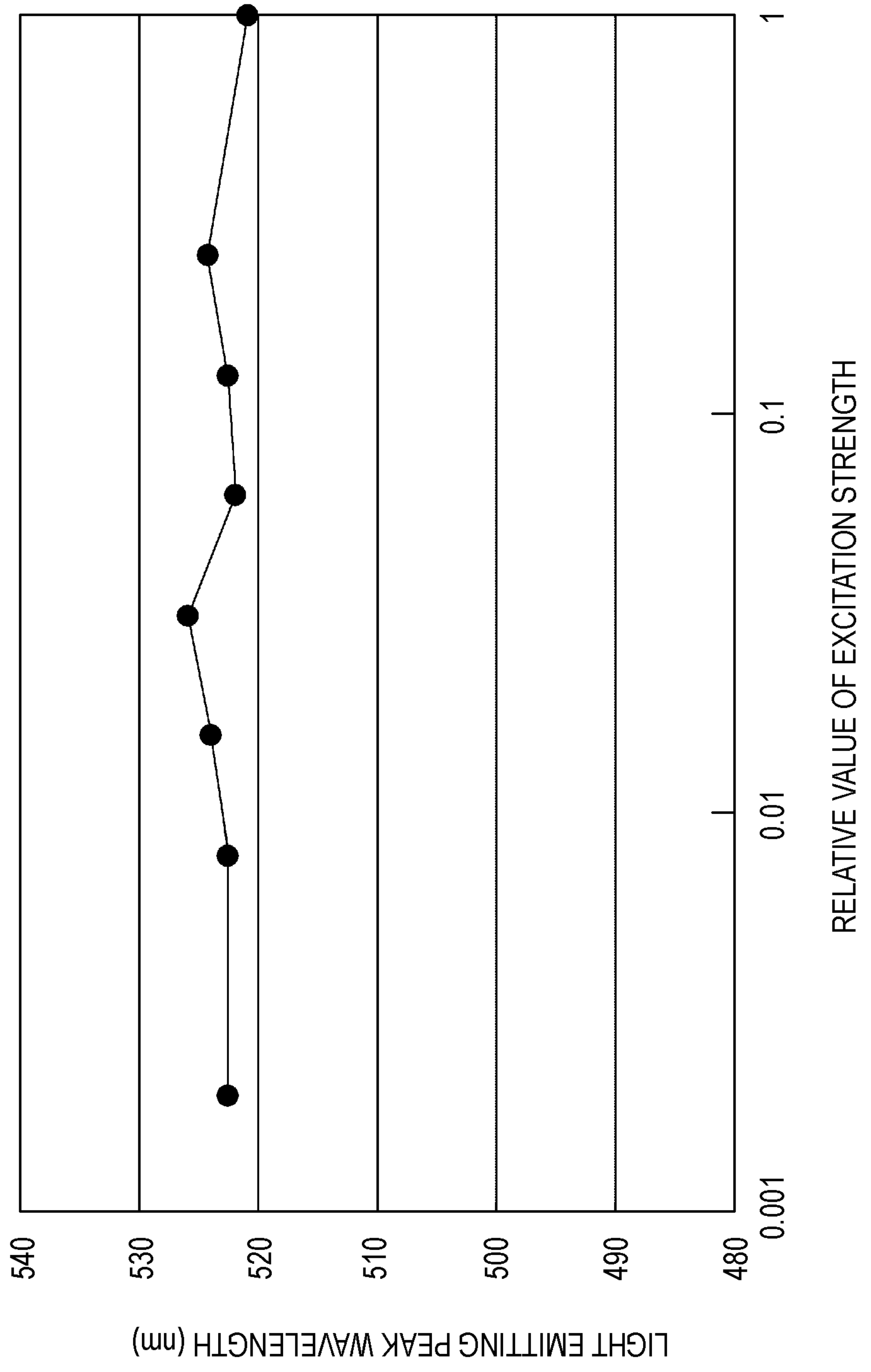
FIG. 3 is a graph showing the result of measuring the light emitting wavelength of a lamination structure in an example in which laser light of an ultra-short pulse is irradiated to the lamination structure of the GaN-based compound semiconductor layer obtained in Embodiment 1 so as to perform laser excitation.

In contrast, for example, an ultra-short pulse of 2 picoseconds (that is, a time from the start of the injection of the carrier and the stoppage of the injection of the carrier is 2 picoseconds) is irradiated to the lamination structure, phenomenally, after light emission is started by the start of the injection of the carrier, the injection of the carrier is stopped before the light emission luminance value becomes constant. Alternatively, after light emission is started by the start of the injection of the carrier, the injection of the carrier is stopped before the inclination of the energy band in the active layer due to the injection of the carrier is changed. Alternatively, after light emission is started by the start of the injection of the carrier, the injection of the carrier is stopped before screening occurs in the active layer due to the injection of the carrier. As a result, even when the excitation strength is changed, the light emitting wavelength of the lamination structure is not changed. Actually, the result of measuring the light emitting wavelength of the lamination structure is shown in FIG. 3. It may be seen from FIG. 3 that the light emitting wavelength of the lamination structure is not substantially changed even when the relative value of the excitation strength is increased by two digits or more.

Figure 6:
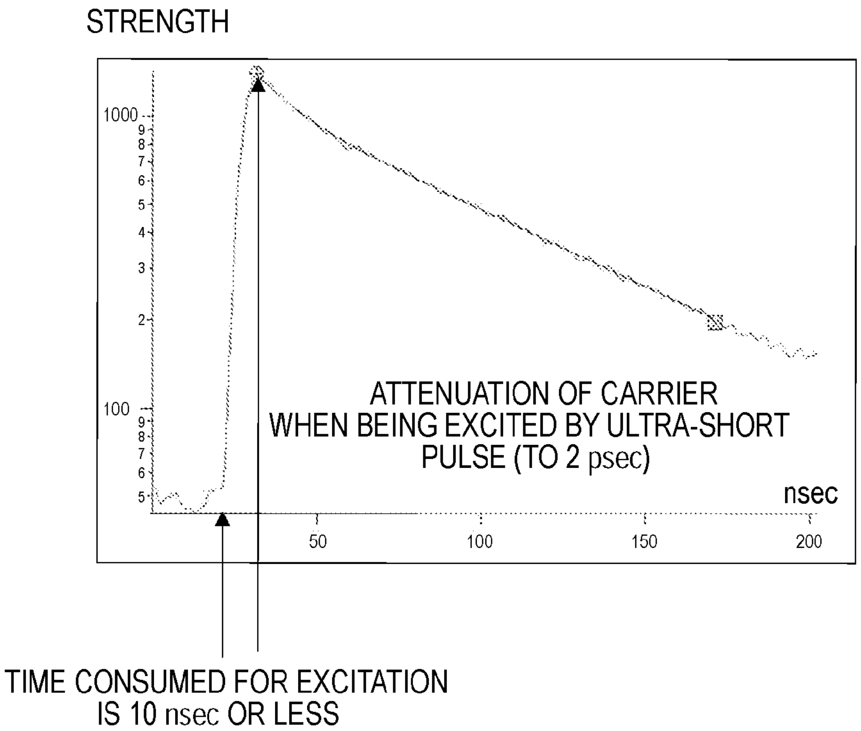
FIG. 6 is a diagram showing a state in which carriers are attenuated when an ultra-short pulse is irradiated to a lamination structure of the GaN-based compound semiconductor layer obtained in Embodiment 1.

In addition, a state in which the carrier is attenuated when the ultra-short pulse of 2 picoseconds is irradiated to the lamination structure is schematically shown in FIG. 6. It may be seen from FIG. 6 that about 5 nanoseconds are necessary for rise of the injection of the carrier. Accordingly, if the irradiation of the excitation pulse is stopped within 10 nanoseconds, a screening degree is not easily changed even when the excitation strength is changed and the wavelength is not easily shifted.

Figure 5:
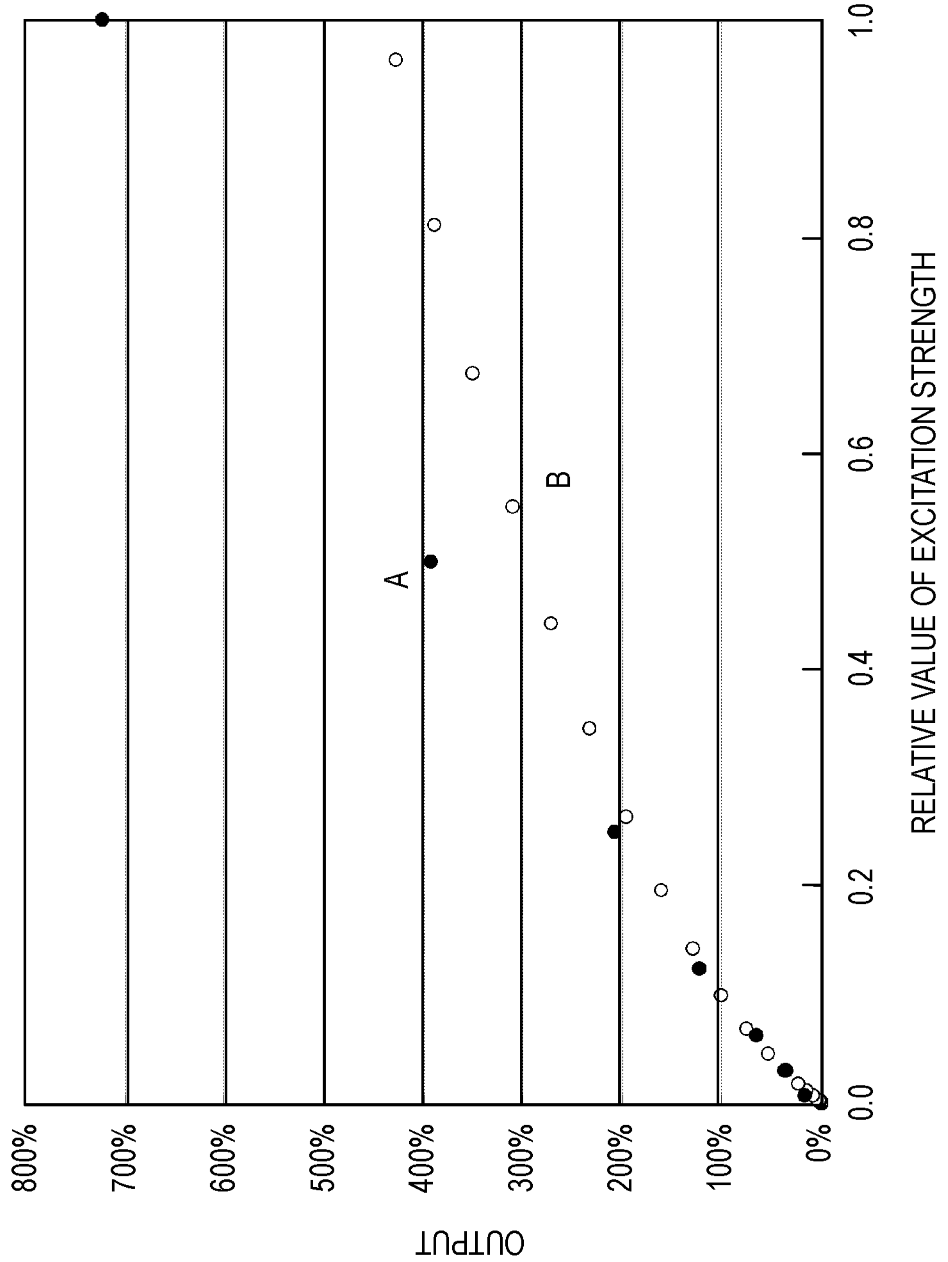
FIG. 5 is a graph showing a result of measuring a relationship between a relative value of excitation strength and a light output in an example in which laser light of an ultra-short pulse is irradiated to the lamination structure of the GaN-based compound semiconductor layer obtained in Embodiment 1 so as to perform laser excitation and a reference example in which continuous oscillation laser light is irradiated so as to perform laser excitation.

A result of measuring the relative value of the excitation strength and a light output is shown in FIG. 5. It may be seen from FIG. 5 that, when the light output when the relative value of the excitation strength is 0.1 is “1”, the light output when the relative value of the excitation strength is 1.0 is about “7” in the case where the ultra-short pulse is irradiated to the lamination structure (see “A” series denoted by “black circle”). In contrast, in the case where the continuous oscillation laser light is irradiated to the lamination structure, the light output when the relative value of the excitation strength is 1.0 is about “4” (see “B” series denoted by “white circle”). When the ultra-short pulse is irradiated to the lamination structure, it is possible to obtain a very high light output.

Figure 7:
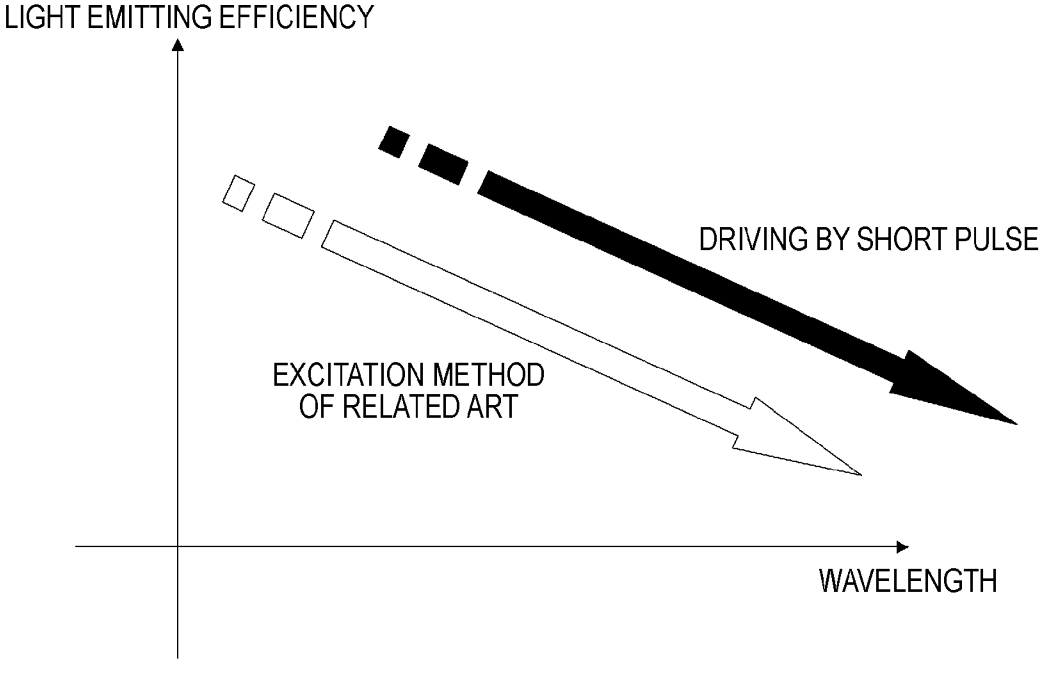
FIG. 7 is a diagram illustrating improvement in efficiency of a long wavelength by applying a method of driving a GaN-based semiconductor light emitting element of Embodiment 1.

According to the driving method of Embodiment 1, even when the excitation strength is high, it is possible to reliably prevent the light emitting wavelength from being shifted to the short wavelength side. Accordingly, since a GaN-based semiconductor light emitting element with high light emission efficiency may be realized and the GaN-based semiconductor light emitting element may emit light with a longer wavelength with high efficiency, the development of the LED from yellow to red which may not be realized in the related art may be expected. In addition, it is known that the light emission efficiency of the GaN-based semiconductor light emitting element for emitting light with a long wavelength is low. Even in this problem, in the GaN-based semiconductor light emitting element having the same structure, in other words, the GaN-based semiconductor light emitting element having the same light emission efficiency, it is possible to emit light with a longer wavelength and to improve efficiency at the long wavelength (see the conceptual diagram of FIG. 7).

Embodiment 2

Embodiment 2 relates to a light emitting device which is suitably used in a method of driving a light emitting device according to first to third embodiments of the present application. The light emitting device of Embodiment 2 includes a GaN-based semiconductor light emitting element and a color conversion material which receives light emitted from the GaN-based semiconductor light emitting element and emits light with a wavelength different from the wavelength of the light emitted from the GaN-based semiconductor light emitting element. The structure of the light emitting device of Embodiment 2 has the same structure as the light emitting device of the related art and the color conversion material is, for example, coated on a light emitting portion of a GaN-based semiconductor light emitting element. The method of driving the GaN-based semiconductor light emitting element in the method of driving of the light emitting device of Embodiment 2 is substantially equal to the method of driving the GaN-based semiconductor light emitting element of Embodiment 1 and thus the detailed description thereof will be omitted.

The basic configuration and structure of the GaN-based semiconductor light emitting element (LED) are equal to those of Embodiment 1. That is, the GaN-based semiconductor light emitting element includes (A) a first GaN-based compound semiconductor layer 13 having a first conductive type (in detail, an n-type conductive type), (B) an active layer 15 having a multiple quantum well structure including well layers and a barrier layer partitioning the well layer and the well layer, and (C) a second GaN-based compound semiconductor layer 17 having a second conductive type (in detail, a p-type conductive type).

In Embodiment 2, the light emitted from the GaN-based semiconductor light emitting element is blue, the light emitted from the color conversion material is yellow, the color conversion material is formed of a YAG (yttrium-aluminum-garnet)-based phosphor particle, and the light (blue) emitted from the GaN-based semiconductor light emitting element and the light (yellow) emitted from the color conversion material are mixed so as to emit white light.

Alternatively, in Embodiment 2, the light emitted from the GaN-based semiconductor light emitting element is blue, the light emitted from the color conversion material is green and red, and the light (blue) emitted from the GaN-based semiconductor light emitting element and the light (green and red) emitted from the color conversion material are mixed so as to emit white light. The color conversion material for emitting green light is more specially a green light emitting phosphor particle excited by the blue light emitted from the GaN-based semiconductor light emitting element of $SrGa_2S_4$:Eu and the color conversion material for emitting red light is specially a red light emitting phosphor particle excited by the blue light emitted from the GaN-based semiconductor light emitting element of CaS:Eu.

In Embodiment 2, even when the driving current (operating current) of the GaN-based semiconductor light emitting element is increased in order to the luminance (brightness) of the light emitting device, the light emitting wavelength of the GaN-based semiconductor light emitting element for exciting the color conversion material is not shifted. Accordingly, it is possible to prevent problems that the excitation efficiency of the color conversion material is changed, chromaticity is changed, and a light emitting device with uniform chromaticity is not easily obtained.

Embodiment 3

Embodiment 3 relates to an image display device which is suitably used in a method of driving a GaN-based semiconductor light emitting element in an image display device according to an embodiment of the present application. The image display device of Embodiment 3 is an image display device including the GaN-based semiconductor light emitting element for displaying an image, and the basic configuration and structure of the GaN-based semiconductor light emitting element (LED) are equal to those of Embodiment 1. That is, the GaN-based semiconductor light emitting element includes (A) a first GaN-based compound semiconductor layer 13 having a first conductive type (in detail, an n-type conductive type), (B) an active layer 15 having a multiple quantum well structure including well layers and a barrier layer partitioning the well layer and the well layer, and (C) a second GaN-based compound semiconductor layer 17 having a second conductive type (in detail, a p-type conductive type).

As the image display device of Embodiment 3, for example, there is an image display device having the following configuration and structure. Unless special description is made, the number of GaN-based semiconductor light emitting elements constituting the image display device or the light emitting element panel is determined based on the specification of the image display device. The method of driving the GaN-based semiconductor light emitting element in the method of driving of the image display device of Embodiment 3 or Embodiment 4 which will be described below is substantially equal to the method of driving the GaN-based semiconductor light emitting element of Embodiment 1 and thus the detailed description thereof will be omitted.

In the image display device of Embodiment 3 or Embodiment 4 which will be described below, since the light emitting wavelength is not shifted even when the driving current (operating current) of the GaN-based semiconductor light emitting element is increased, variations in a displayed image does not occur. In addition, even in the adjustment of the chromaticity coordinate or luminance between the pixels, since the light emitting wavelength of the GaN-based semiconductor light emitting element is not shifted, a problem that a color reproduction range is narrowed does not occur.

(1-1) 1A-Type Image Display Device

A passive matrix type direct-view image display device which includes (A) a light emitting element panel 50 in which GaN-based semiconductor light emitting elements 1 are arranged in a two-dimensional matrix, and displays an image by controlling light emitting/non-light emitting states of the GaN-based semiconductor light emitting elements 1 and directly viewing the light emitting states of the GaN-based semiconductor light emitting elements 1.

Figure 8A:
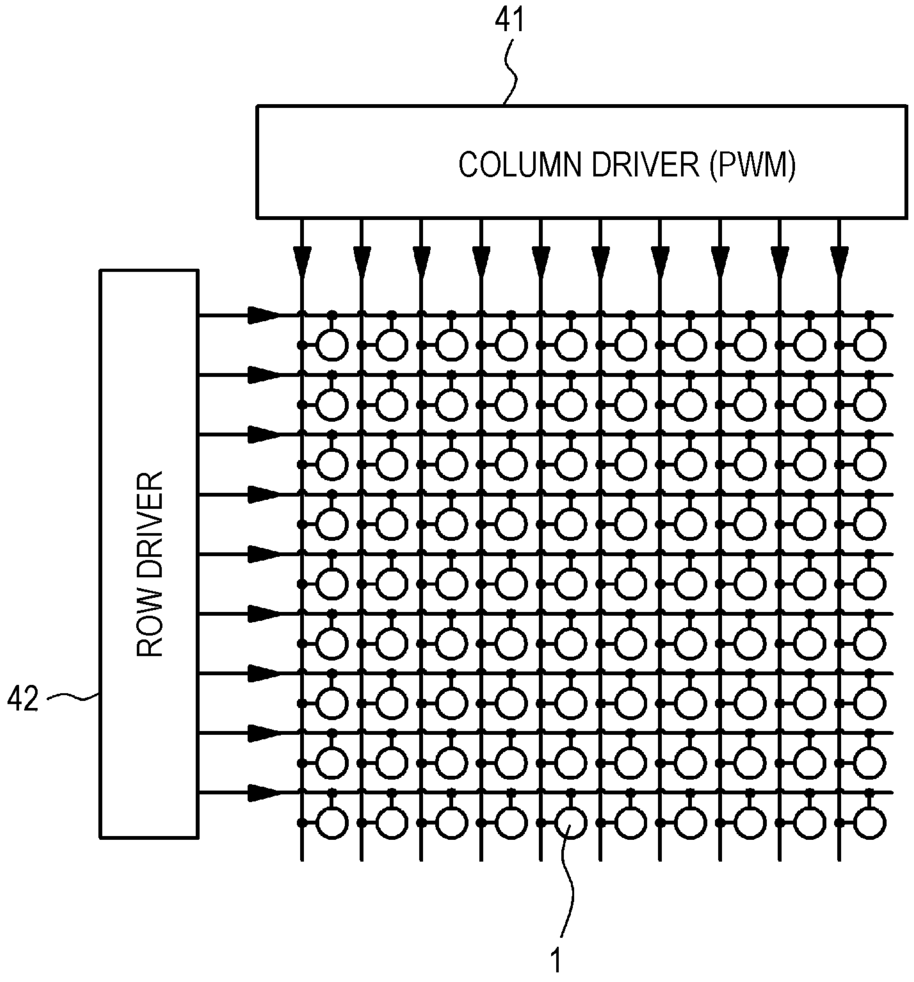
FIG. 8A is a circuit diagram of a passive matrix type direct-view image display device (1A-type image display device) of Embodiment 3.
Figure 8B:
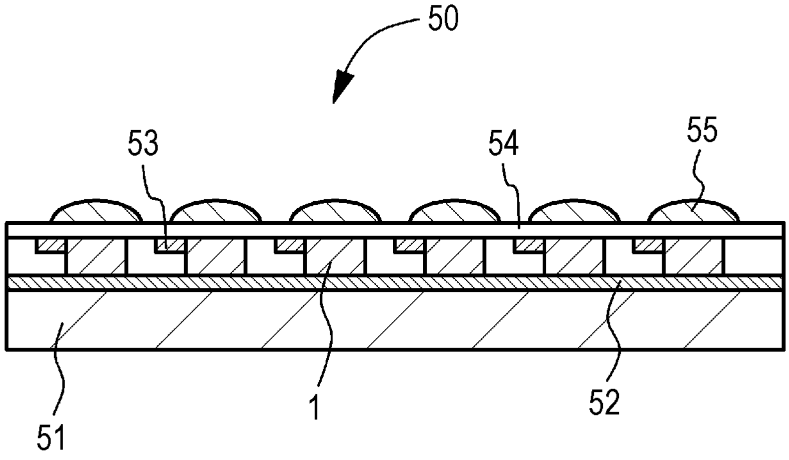
FIG. 8B is a schematic cross-sectional view of a light emitting element panel in which GaN-based semiconductor light emitting elements are arranged in a two-dimensional matrix.

A circuit diagram including a light emitting element panel 50 configuring such a passive matrix type direct-view image display device is shown in FIG. 8A and a schematic cross-sectional view of the light emitting element panel in which the GaN-based semiconductor light emitting elements 1 are arranged in a two-dimensional matrix is shown in FIG. 8B, in which one electrode (a p-side electrode or an n-side electrode) of each of the GaN-based semiconductor light emitting elements 1 is connected to a column driver 41 and the other electrode (an n-side electrode or a p-side electrode) of each of the GaN-based semiconductor light emitting elements 1 is connected to a row driver 42. The control of the light emitting/non-light emitting states of the GaN-based semiconductor light emitting elements 1 is, for example, performed by the row driver 42, and driving current for driving the GaN-based semiconductor light emitting elements 1 is supplied from the column driver 41.

The light emitting element panel 50 includes, for example, a support 51 formed of a printed wiring board, the GaN-based semiconductor light emitting elements 1 mounted on the support 51, an X-direction wire 52 formed on the support 51, electrically connected to one electrode (the p-side electrode or the n-side electrode) of each of the GaN-based semiconductor light emitting elements 1, and connected to the column driver 41 or the row driver 42, a Y-direction wire 53 electrically connected to the other electrode (the n-side electrode or the p-side electrode) of each of the GaN-based semiconductor light emitting elements 1 and connected to the row driver 42 or the column driver 41, a transparent base material 54 for covering the GaN-based semiconductor light emitting elements 1, and a micro lens 55 provided on the transparent base material 54. The light emitting element panel 50 is not limited to such a configuration.

(1-2) 1B-Type Image Display Device

An active matrix type direct-view image display device which includes (A) a light emitting element panel in which GaN-based semiconductor light emitting elements 1 are arranged in a two-dimensional matrix, and displays an image by controlling light emitting/non-light emitting states of the GaN-based semiconductor light emitting elements 1 and directly viewing the light emitting states of the GaN-based semiconductor light emitting elements 1.

Figure 9:
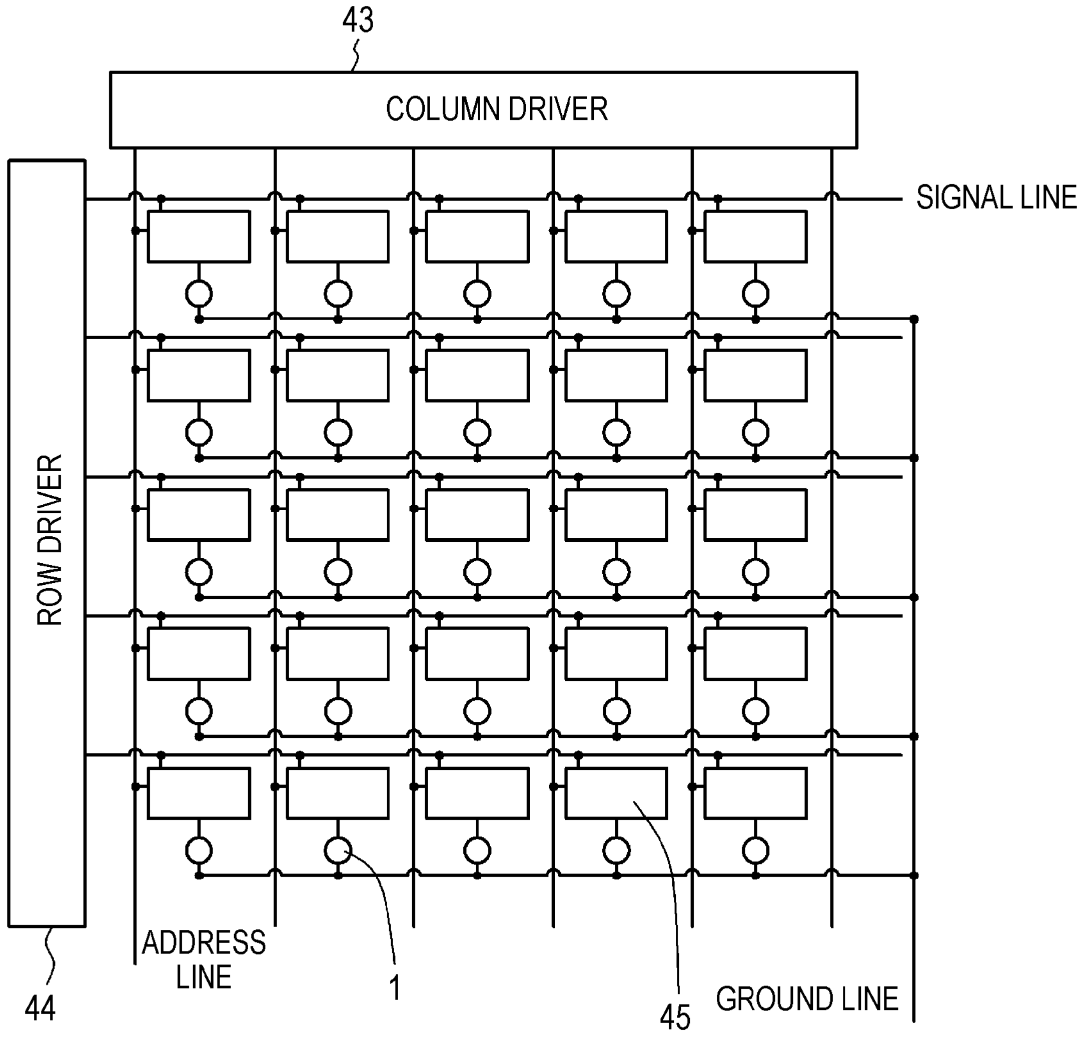
FIG. 9 is a circuit diagram of an active matrix type direct-view image display device (1B-type image display device) of Embodiment 3.

A circuit diagram including a light emitting element panel configuring such an active matrix type direct-view image display device is shown in FIG. 9, in which one electrode (a p-side electrode or an n-side electrode) of each of the GaN-based semiconductor light emitting elements 1 is connected to a driver 45, and the driver 45 is connected to the column driver 43 and the row driver 44. The other electrode (an n-side electrode or a p-side electrode) of each of the GaN-based semiconductor light emitting elements 1 is connected to a ground line. The control of the light emitting/non-light emitting states of the GaN-based semiconductor light emitting elements 1 is, for example, performed by the driver 45 using the row driver 44, and a luminance signal for driving the GaN-based semiconductor light emitting elements 1 is supplied from the column driver 43 to the driver 45.

(2) Second-Type Image Display Device

A passive matrix type or active matrix type projection image display device which includes (A) a light emitting element panel 50 in which GaN-based semiconductor light emitting elements 1 are arranged in a two-dimensional matrix, and displays an image by controlling light emitting/non-light emitting states of the GaN-based semiconductor light emitting elements 1 and performing projection onto a screen.

Figure 10:
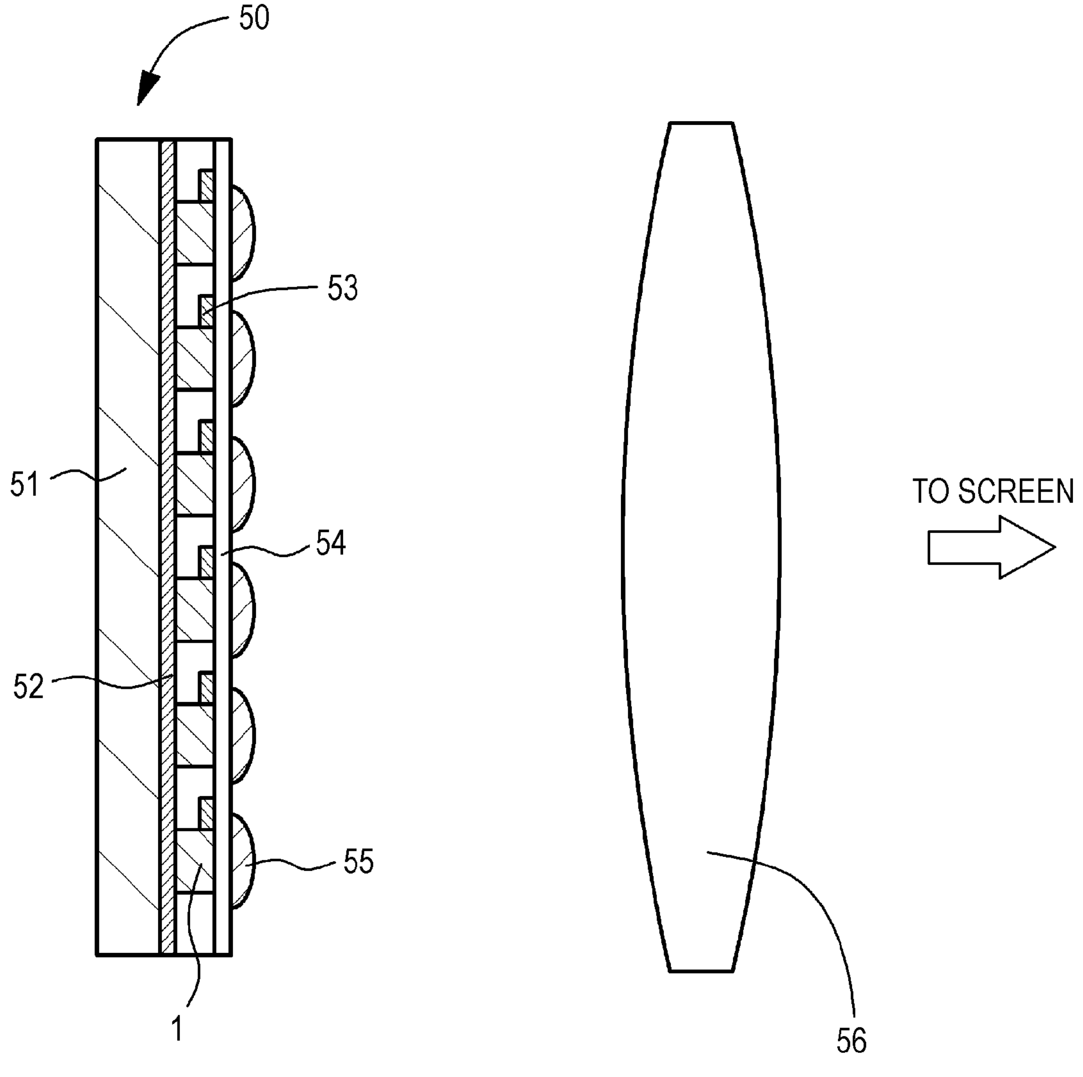
FIG. 10 is a conceptual diagram of a projection image display device (second-type image display device) including a light emitting element panel in which GaN-based semiconductor light emitting elements are arranged in a two-dimensional matrix.

A circuit diagram including a light emitting element panel configuring such a passive matrix type image display device is equal to that of FIG. 8A, a circuit diagram including a light emitting element panel configuring such an active matrix type image display device is equal to that of FIG. 9, and thus the detailed description will be omitted. A conceptual diagram of the light emitting element panel 50 in which the GaN-based semiconductor light emitting elements 1 are arranged in a two-dimensional matrix is shown in FIG. 10, in which the light emitted from the light emitting element panel 50 is projected onto a screen via a projection lens 56. The configuration and structure of the light emitting element panel 50 are equal to those of the light emitting element panel 50 described with reference to FIG. 8B and thus the detailed description will be omitted.

(3) Third-Type Image Display Device

A direct-view or projection color-display image display device which includes (A) a red light emitting element panel 50R in which semiconductor light emitting elements 1R for emitting red light (for example, AlGaInP-based semiconductor light emitting elements or GaN-based semiconductor light emitting elements) are arranged in a two-dimensional matrix, (B) a green light emitting element panel 50G in which GaN-based semiconductor light emitting elements 1G for emitting green light are arranged in a two-dimensional matrix, (C) a blue light emitting element panel 50B in which GaN-based semiconductor light emitting elements 1B for emitting blue light are arranged in a two-dimensional matrix, and (D) a unit (for example, a dichroic prism 57) for collecting lights emitted from the red light emitting element panel 50R, the green light emitting element panel 50G and the blue light emitting element panel 50B into one light path, and controls light emitting/non-light emitting states of the red light emission semiconductor light emitting elements 1R, the green light emission GaN-based semiconductor light emitting elements 1G and the blue light emission GaN-based light emitting elements 1B.

Figure 11:
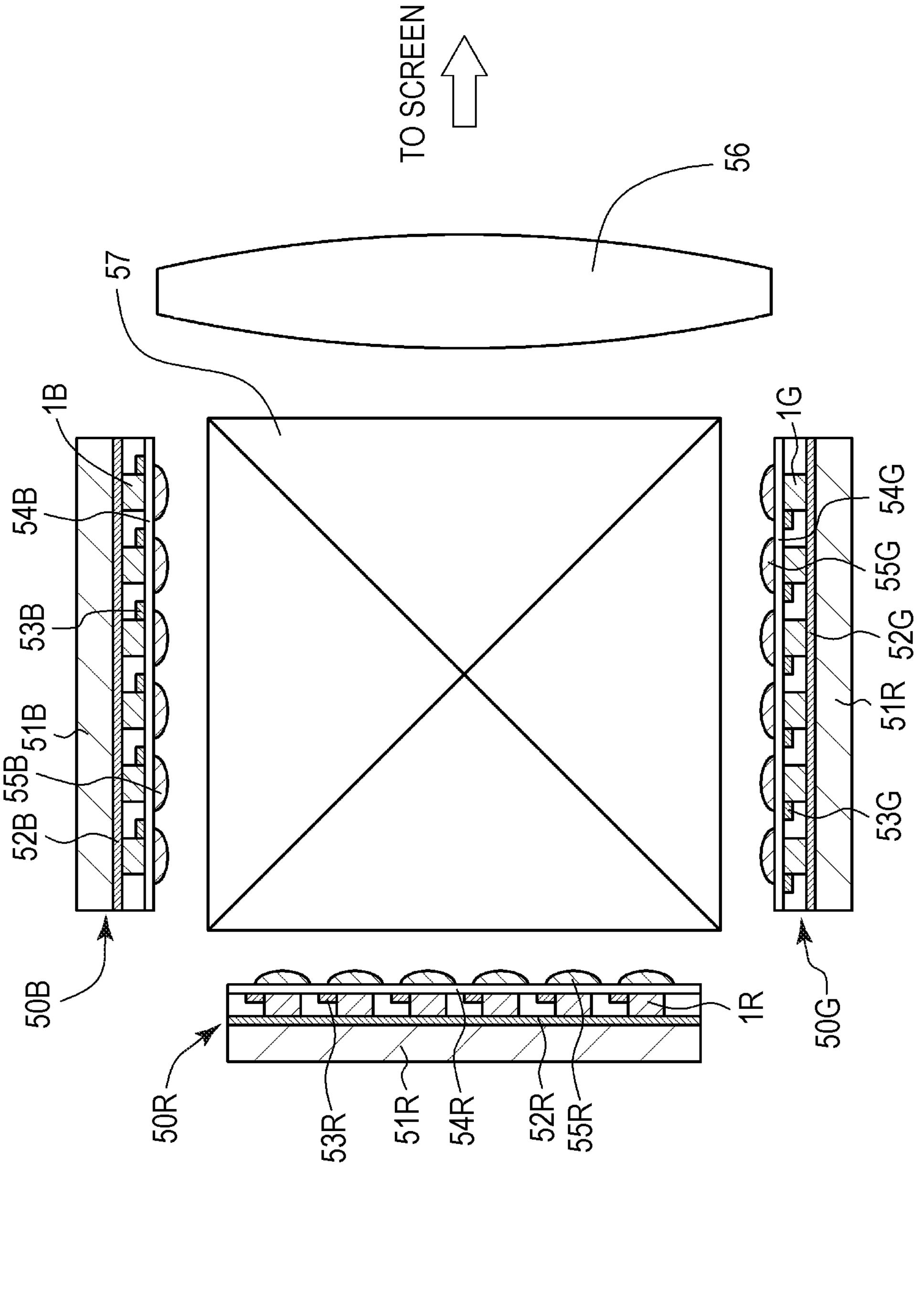
FIG. 11 is a conceptual diagram of a projection color-display image display device (third-type image display device) including a red light emitting element panel, a green light emitting element panel, and a blue light emitting element panel.

A circuit diagram including a light emitting element panel configuring such a passive matrix type image display device is equal to that of FIG. 8A, a circuit diagram including a light emitting element panel configuring such an active matrix type image display device is equal to that of FIG. 9, and thus the detailed description will be omitted. In addition, a conceptual diagram of the light emitting element panels 50R, 50G and 50B in which the GaN-based semiconductor light emitting elements 1R, 1G and 1B are arranged in a two-dimensional matrix is shown in FIG. 11, in which the lights emitted from the light emitting element panels 50R, 50G and 50B are incident to a dichroic prism 57 such that the light paths thereof are collected to one path, and are directly viewed in the direct-view image display device or are projected onto a screen via a projection lens 56 in the projection image display device. The configuration and structure of the light emitting element panels 50R, 50G and 50B are equal to those of the light emitting element panel 50 described with reference to FIG. 8B and thus the detailed description will be omitted.

In such an image display device, each of the semiconductor light emitting elements 1R, 1G and 1B configuring the light emitting element panels 50R, 50G and 50B is preferably formed of the GaN-based semiconductor light emitting element 1 described in Embodiment 1, but, if necessary, the semiconductor light emitting element 1R configuring the light emitting element panel 50R may be formed of an AlInGaP-based compound semiconductor light emitting diode and the semiconductor light emitting elements 1G and 1B configuring the light emitting element panels 50G and 50B may be formed of the GaN-based semiconductor light emitting element 1 described in Embodiment 1.

(4) Fourth-Type Image Display Device

A direct-view or projection image display device which includes (A) GaN-based semiconductor light emitting elements 101, and (B) a light passing control device (for example, a liquid crystal display device 58 including a high-temperature polysilicon type thin film transistor, and the same is true in the following description) which is one kind of light valve for controlling passing/non-passing of lights emitted from the GaN-based semiconductor light emitting elements 101, and displays an image by controlling the passing/non-passing of the lights emitted from the GaN-based semiconductor light emitting elements 101 by the liquid crystal display device 58 which is the light passing control device.

Figure 12:
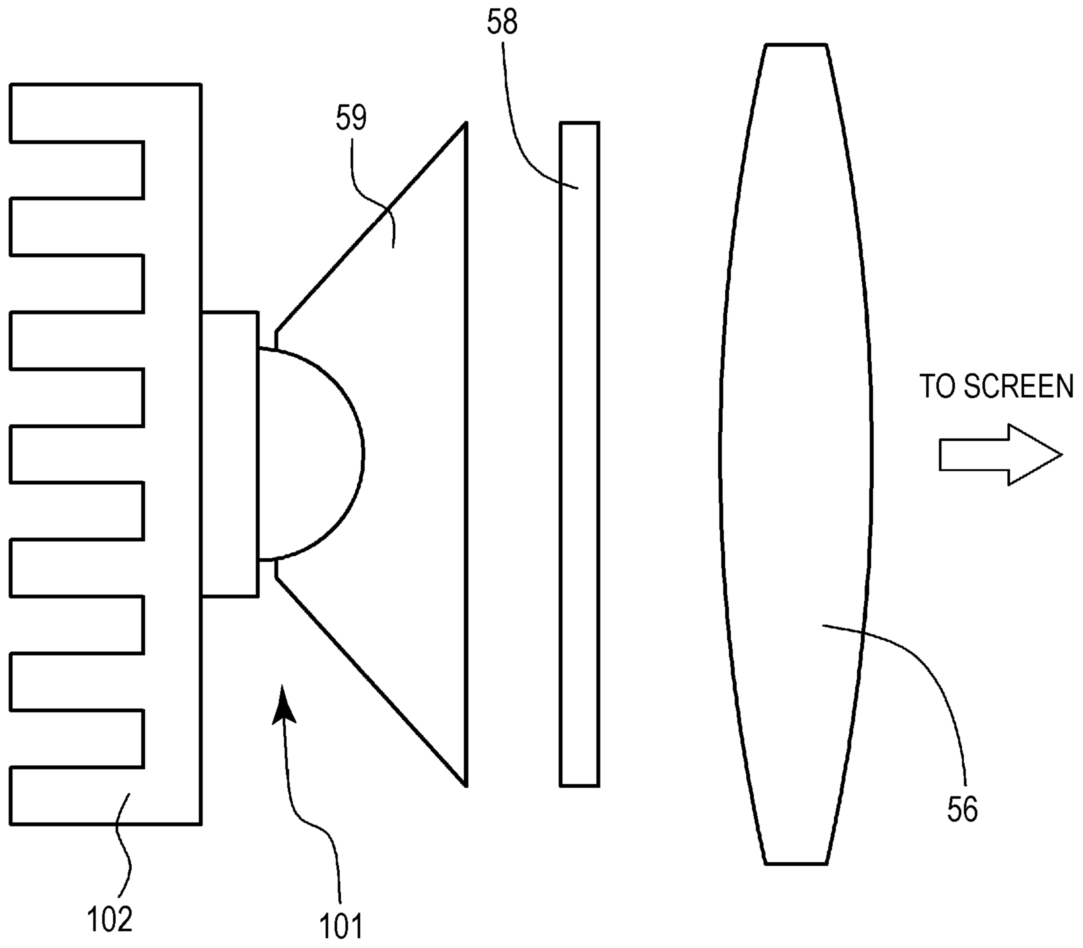
FIG. 12 is a conceptual diagram of a projection image display device (fourth-type image display device) including a GaN-based semiconductor light emitting element and a light passing control device.

The number of GaN-based semiconductor light emitting elements is determined based on the specification of the image display device and may be one or plural. In an example in which a conceptual diagram of the image display device is shown in FIG. 12, the number of GaN-based semiconductor light emitting elements 101 is one and the GaN-based semiconductor light emitting elements 101 are mounted in the heat sink 102. The light emitted from the GaN-based semiconductor light emitting elements 101 is guided by a light guide member formed of a light transmission material such as silicon resin, epoxy resin or polycarbonate resin or a light guide member 59 formed of a reflector such as a mirror so as to be incident to the liquid crystal display device 58. The light emitted from the liquid crystal display device 58 is directly viewed in the direct-view image display device or is projected onto a screen via a projection lens 56 in the projection image display device. The GaN-based semiconductor light emitting element 101 may be a GaN-based semiconductor light emitting element 1 described in Embodiment 1.

Figure 13:
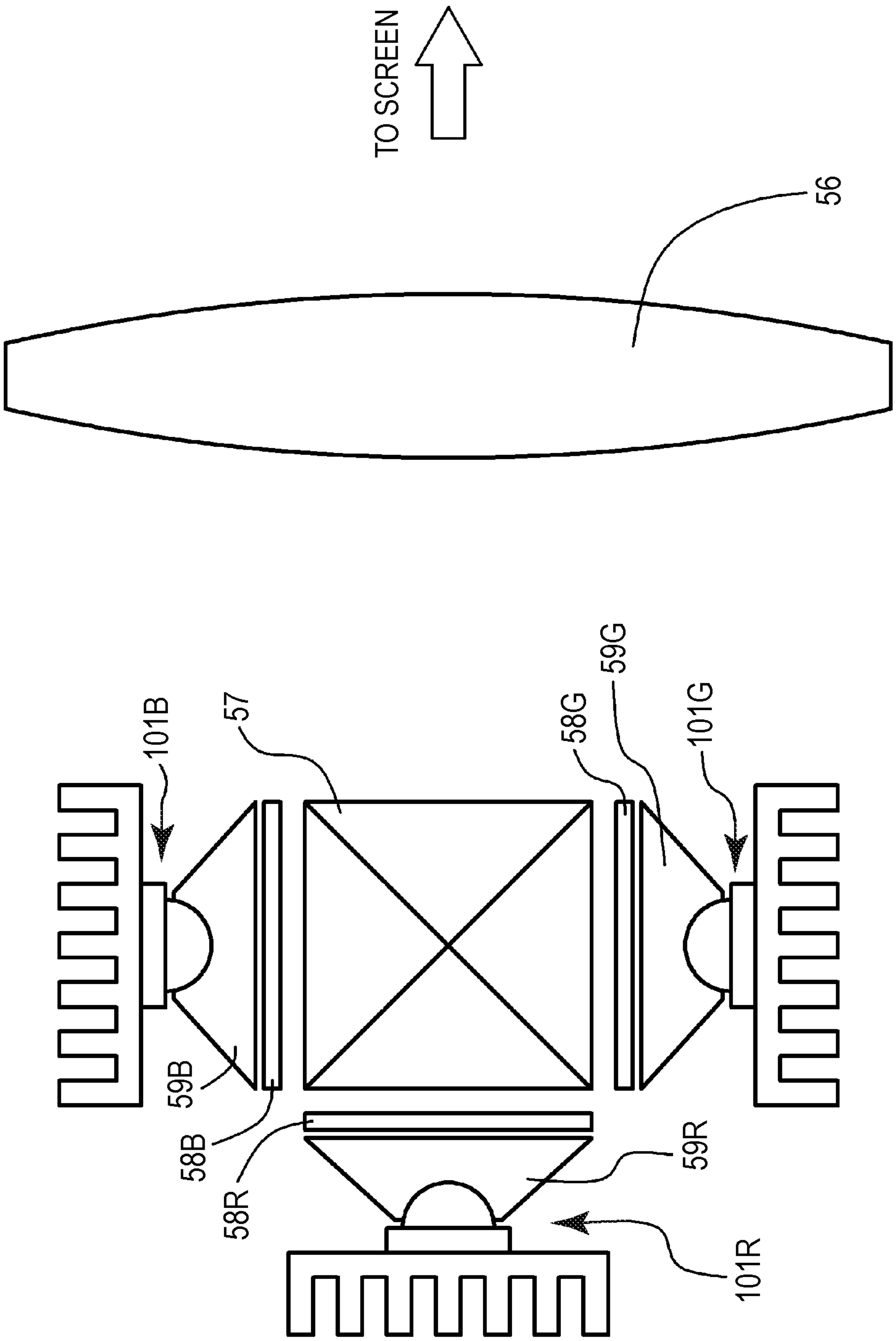
FIG. 13 is a conceptual diagram of a projection color-display image display device (fourth-type image display device) including three sets of GaN-based semiconductor light emitting elements and light passing control devices.

In addition, by an image display device including a semiconductor light emitting element (for example, an AlGaInP-based semiconductor light emitting element or a GaN-based semiconductor light emitting element) 101R for emitting red light, a light passing control device (for example, the liquid crystal display device 58R) which is one kind of light valve for controlling the passing/non-passing of the light emitted from the semiconductor light emitting element 101R for emitting red light, a GaN-based semiconductor light emitting element 101G for emitting green light, a light passing control device (for example, the liquid crystal display device 58G) which is one kind of light valve for controlling the passing/non-passing of the light emitted from the GaN-based semiconductor light emitting element 101G for emitting green light, a GaN-based semiconductor light emitting element 101B for emitting blue light, a light passing control device (for example, the liquid crystal display device 58B) which is one kind of light valve for controlling the passing/non-passing of the light emitted from the GaN-based semiconductor light emitting element 101B for emitting blue light, light guide members 59R, 59G and 59B for guiding the lights emitted from the GaN-based semiconductor light emitting elements 101R, 101G and 101B, and a unit (for example, a dichroic prism 57) for collecting lights into one light path, it is possible to obtain a direct-view or projection color-display image display device. In addition, an example in which a conceptual diagram is shown in FIG. 13 is a projection color-display image display device.

In such an image display device, each of the semiconductor light emitting elements 101R, 101G and 101B is preferably formed of the GaN-based semiconductor light emitting element 1 described in Embodiment 1, but, if necessary, the semiconductor light emitting element 101R may be formed of an AlInGaP-based compound semiconductor light emitting diode and the semiconductor light emitting elements 101G and 101B may be formed of the GaN-based semiconductor light emitting element 1 described in Embodiment 1.

(5) Fifth-Type Image Display Device

A directive-view or projection image display device which includes (A) a light emitting element panel 50 in which GaN-based semiconductor light emitting elements are arranged in a two-dimensional matrix, and (B) a light passing control device (liquid crystal display device 58) for controlling passing/non-passing of lights emitted from the GaN-based semiconductor light emitting elements 1, and displays an image by controlling the passing/non-passing of the lights emitted from the GaN-based semiconductor light emitting elements 1 by the light passing control device (liquid crystal display device 58).

Figure 14:
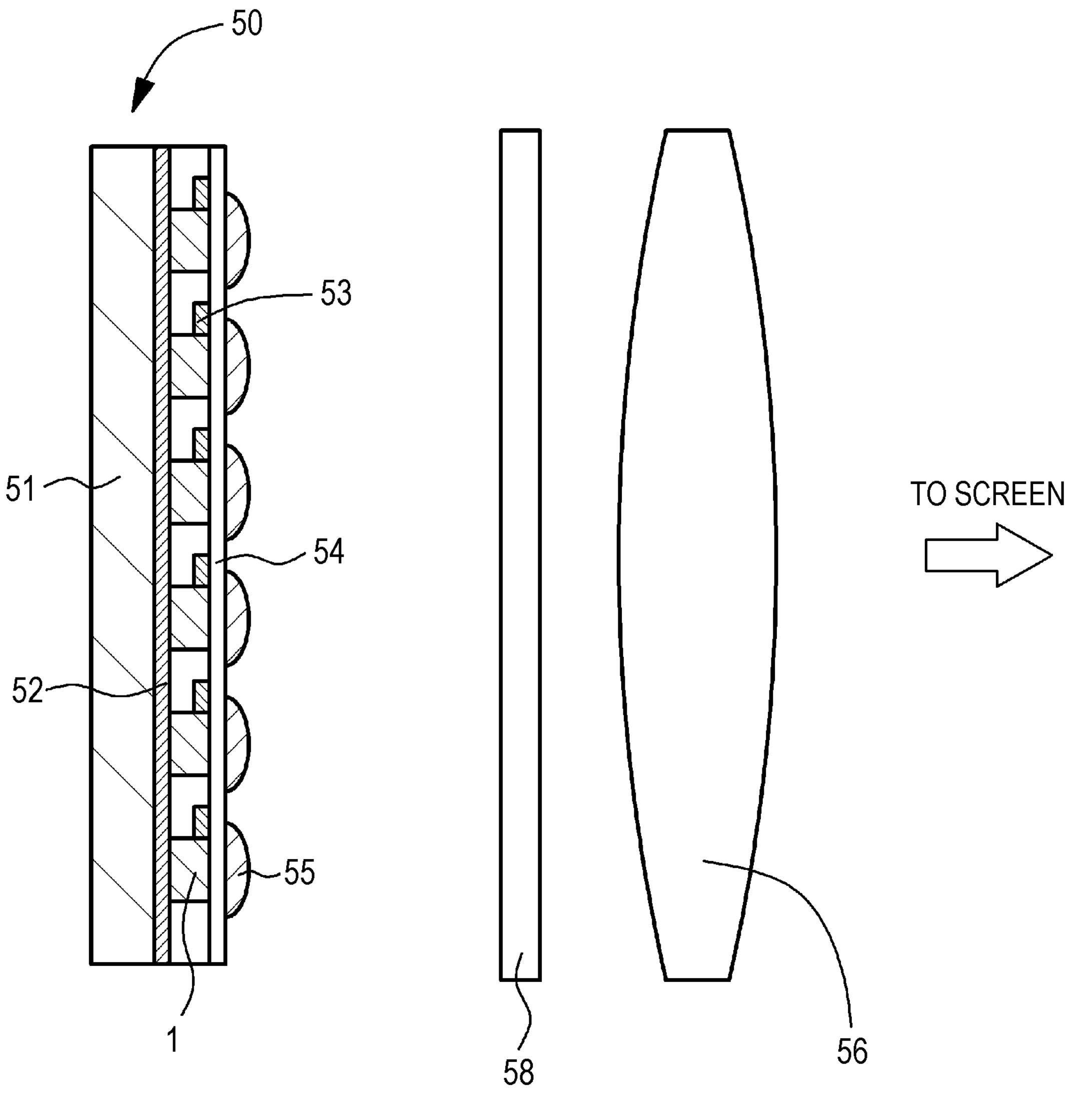
FIG. 14 is a conceptual diagram of a projection image display device (fifth-type image display device) including a light emitting element panel and a light passing control device.

A conceptual diagram of the light emitting element panel 50 is shown in FIG. 14, the configuration and structure of the light emitting element panel 50 are equal to those of the light emitting element panel 50 described with reference to FIG. 8B and thus the detailed description will be omitted. In addition, since the passing/non-passing and the brightness of the light emitted from the light emitting element panel 50 are controlled by the operation of the liquid crystal display device 58, the GaN-based semiconductor light emitting elements 1 configuring the light emitting element panel 50 may be always turned on or may be repeatedly turned on/off in a predetermined period. The light emitted from the light emitting element panel 50 is incident to the liquid crystal display device 58 and the light emitted from the liquid crystal display device 58 is directly viewed in the direct-view image display device or is projected onto a screen via a projection lens 56 in the projection image display device.

(6) Sixth-Type Image Display Device

A (directive-view or projection) color-image image display device which includes (A) a red light emitting element panel 50R in which semiconductor light emitting elements (for example, AlGaInP-based semiconductor light emitting elements or GaN-based semiconductor light emitting elements) 1R for emitting red light are arranged in a two-dimensional matrix, and a red light passing control device (liquid crystal display device 58R) for controlling passing/non-passing of light emitted from the red light emitting element panel 50R, (B) a green light emitting element panel 50G in which GaN-based semiconductor light emitting elements 1G for emitting green light are arranged in a two-dimensional matrix, and a green light passing control device (liquid crystal display device 58G) for controlling passing/non-passing of light emitted from the green light emitting element panel 50G, (C) a blue light emitting element panel 50B in which GaN-based semiconductor light emitting elements 1B for emitting blue light are arranged in a two-dimensional matrix, and a blue light passing control device (liquid crystal display device 58B) for controlling passing/non-passing of light emitted from the blue light emitting element panel 50B, and (D) a unit (for example, a dichroic prism 57) for collecting lights passing through the red light passing control device 58R, the green light passing control device 58G and the blue light passing control device 58B into one light path, and displays an image by controlling the passing/non-passing of the lights emitted from the light emitting element panels 50R, 50G and 50B by the light passing control devices 58R, 58G and 58B.

Figure 15:
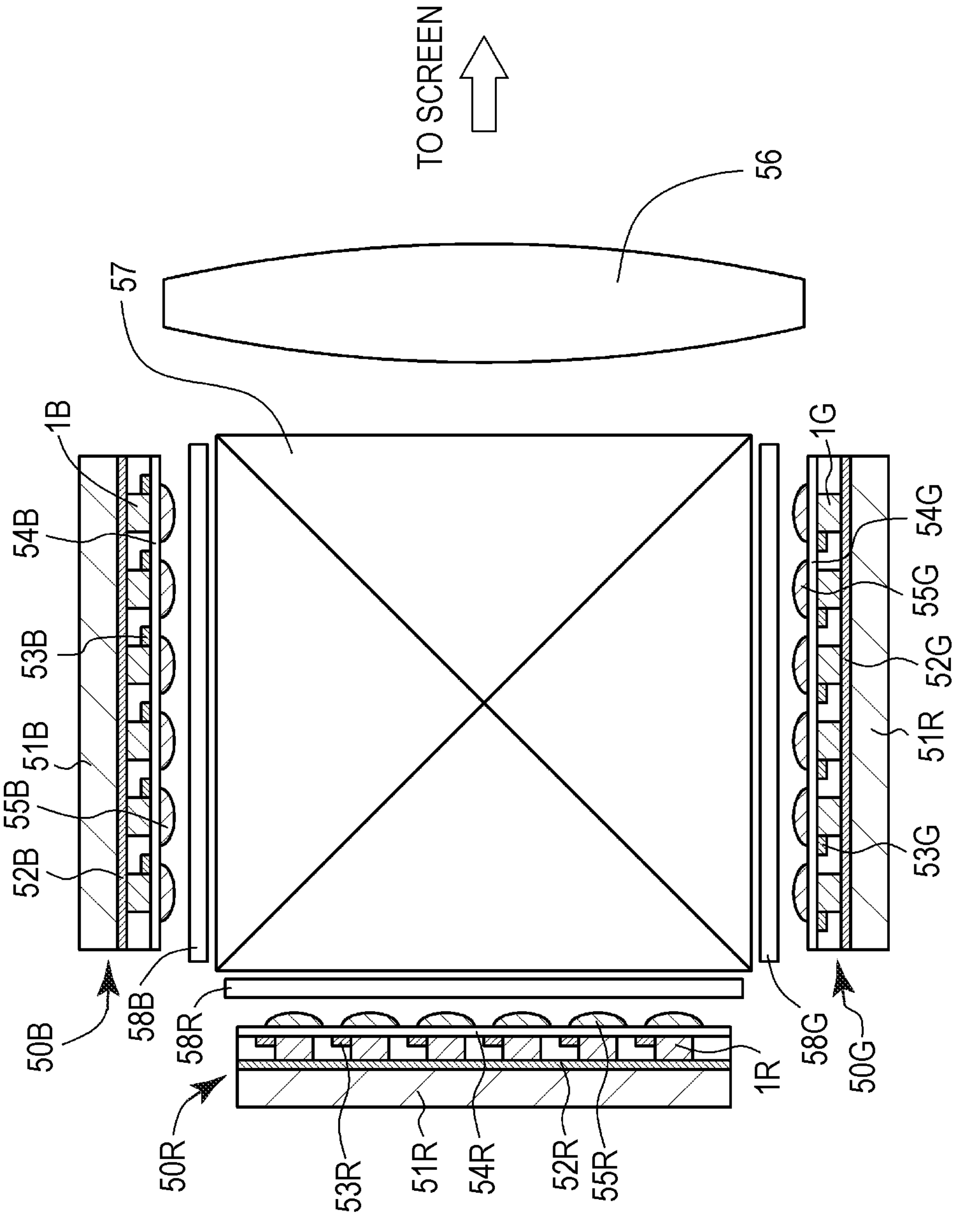
FIG. 15 is a conceptual diagram of a projection color-display image display device (sixth-type image display device) including three sets of GaN-based semiconductor light emitting elements and light passing control devices.

A conceptual diagram of the light emitting element panels 50R, 50G and 50B in which the GaN-based semiconductor light emitting elements 1R, 1G and 1B are arranged in a two-dimensional matrix is shown in FIG. 15, in which the passing/non-passing of the lights emitted from the light emitting element panels 50R, 50G and 50R is controlled by the light passing control devices 58R, 58G and 58B, the lights are incident to the dichroic prism 57 such that the light paths thereof are collected into one light path, and are directly viewed in the direct-view image display device or is projected onto a screen via a projection lens 56 in the projection image display device. The configuration and structure of the light emitting element panels 50R, 50G and 50B are equal to those of the light emitting element panel 50 described with reference to FIG. 8B and thus the detailed description will be omitted.

In such an image display device, each of the semiconductor light emitting elements 1R, 1G and 1B configuring the light emitting element panels 50R, 50G and 50B is preferably formed of the GaN-based semiconductor light emitting element 1 described in Embodiment 1, but, if necessary, the semiconductor light emitting element 1R configuring the light emitting element panel 50R may be formed of an AlInGaP-based compound semiconductor light emitting diode and the semiconductor light emitting elements 1G and 1B configuring the light emitting element panel 50G and 50B may be formed of the GaN-based semiconductor light emitting element 1 described in Embodiment 1.

(7) Seventh-Type Image Display Device

A field sequential type (direct-view or projection) color-display image display device which includes (A) semiconductor light emitting elements (for example, AlGaInP-based semiconductor light emitting elements or GaN-based semiconductor light emitting elements) 1R for emitting red light, (B) GaN-based semiconductor light emitting elements 1G for emitting green light, and (C) GaN-based semiconductor light emitting elements 1B for emitting blue light, (D) a unit (for example, a dichroic prism 57) for collecting lights emitted from the semiconductor light emitting elements 1R for emitting red light, the GaN-based semiconductor light emitting elements 1G for emitting green light and the GaN-based semiconductor light emitting elements 1B for emitting blue light into one light path, and (E) a light passing control device (liquid crystal display device 58) for controlling passing/non-passing of light emitted from the unit (dichroic prism 57) for collecting the lights into one light path, and displays an image by controlling the passing/non-passing of the lights emitted from the light emitting elements by the light passing control device 58.

Figure 16:
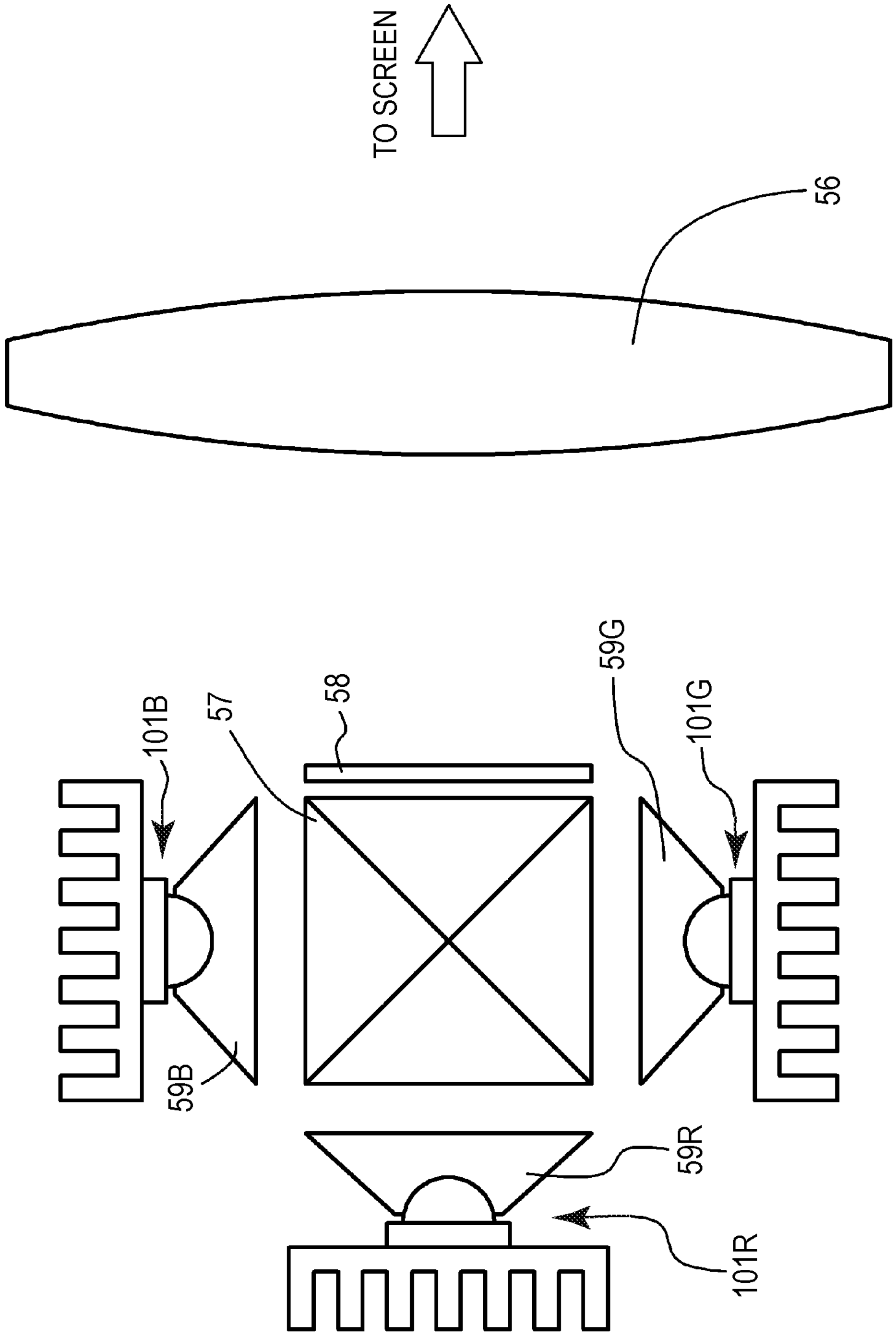
FIG. 16 is a conceptual diagram of a projection color-display image display device (seventh-type image display device) including three sets of GaN-based semiconductor light emitting elements and a light passing control device.

A conceptual diagram of the semiconductor light emitting element panels 101R, 101G and 101B is shown in FIG. 16, in which the lights emitted from the semiconductor light emitting elements 101R, 101G and 101B are incident to the dichroic prism 57 such that the light paths thereof are collected into one light path, the passing/non-passing of the lights emitted from the dichroic prism 57 is controlled by the light passing control device 58, and the lights are directly viewed in the direct-view image display device or is projected onto a screen via a projection lens 56 in the projection image display device. In such an image display device, each of the semiconductor light emitting elements 101R, 101G and 101B is preferably formed of the GaN-based semiconductor light emitting element 1 described in Embodiment 1, but, if necessary, the semiconductor light emitting element 101R may be formed of an AlInGaP-based compound semiconductor light emitting diode and the semiconductor light emitting elements 101G and 101B may be formed of the GaN-based semiconductor light emitting element 1 described in Embodiment 1.

(8) Eighth-Type Image Display Device

A field sequential type (direct-view or projection) color-display image display device which includes (A) a red light emitting element panel 50R in which semiconductor light emitting elements (for example, AlGaInP-based semiconductor light emitting elements or GaN-based semiconductor light emitting elements) 1R for emitting red light are arranged in a two-dimensional matrix, (B) a green light emitting element panel 50G in which GaN-based semiconductor light emitting elements 1G for emitting green light are arranged in a two-dimensional matrix, and (C) a blue light emitting element panel 50B in which GaN-based semiconductor light emitting elements 1B for emitting blue light are arranged in a two-dimensional matrix, (D) a unit (for example, a diachronic prism 57) for collecting lights emitted from the red light emitting element panel 50R, the green light emitting element panel 50G and the blue light emitting element panel 50B into one light path, and (E) a light passing control device (liquid crystal display device 58) for controlling passing/non-passing of light emitted from the unit (dichroic prism 57) for collecting the lights into one light path, and displays an image by controlling the passing/non-passing of the lights emitted from the light emitting element panels 50R, 50G and 50B by the light passing control device 58.

Figure 17:
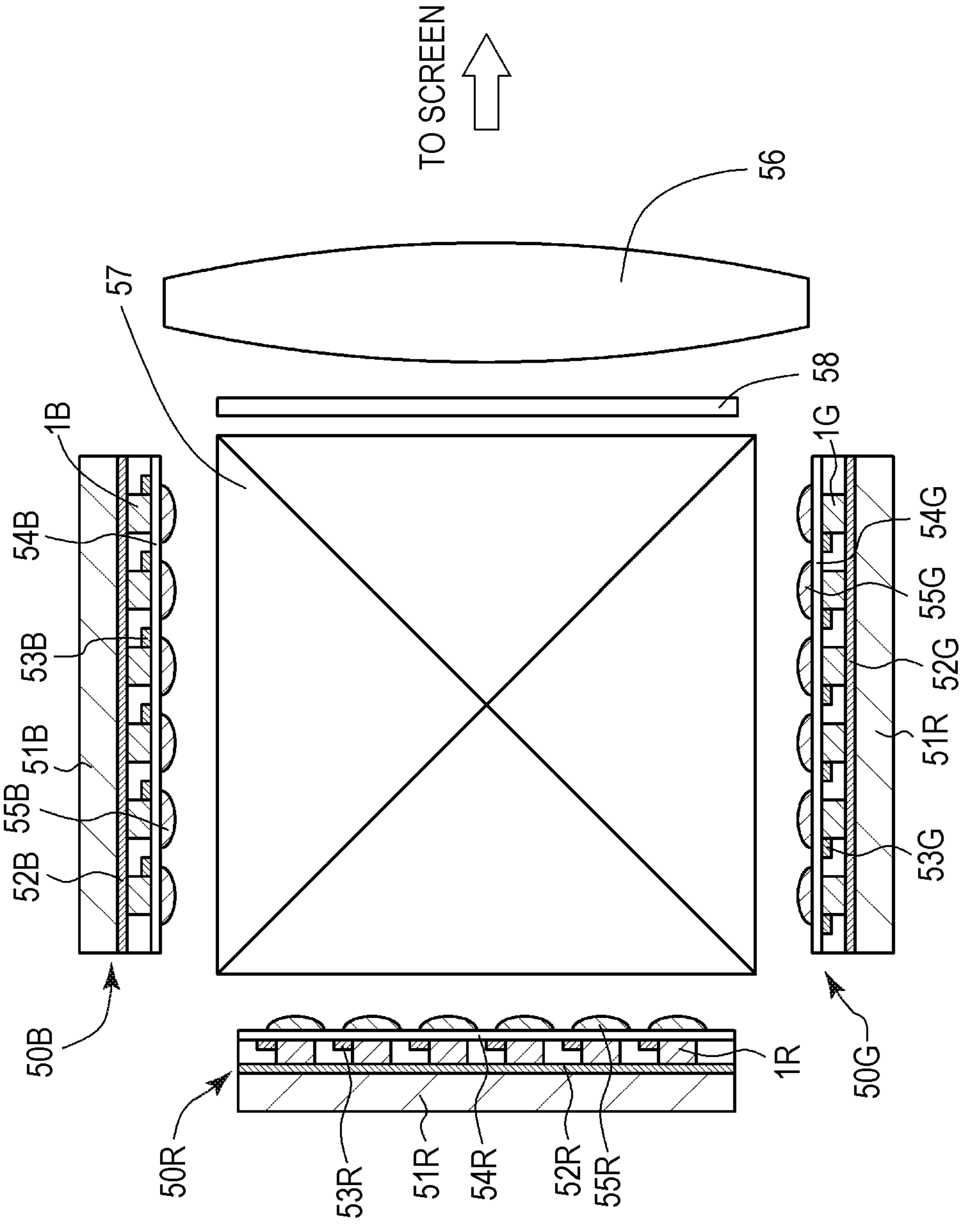
FIG. 17 is a conceptual diagram of a projection color-display image display device (eighth-type image display device) including three sets of GaN-based semiconductor light emitting element panels and a light passing control device.

A conceptual diagram of the light emitting element panels 50R, 50G and 50B in which the GaN-based semiconductor light emitting elements 1R, 1G and 1B are arranged in a two-dimensional matrix is shown in FIG. 17, in which the lights emitted from the light emitting element panels 50R, 50G and 50B are incident to the dichroic prism 57 such that the light paths thereof are collected into one light path, the passing/non-passing of the lights emitted from the dichroic prism 57 is controlled by the light passing control device 58, and the lights are directly viewed in the direct-view image display device or are projected onto a screen via a projection lens 56 in the projection image display device. The configuration and structure of the light emitting element panels 50R, 50G and 50B are equal to those of the light emitting element panel 50 described with reference to FIG. 8B and thus the detailed description will be omitted.

In such an image display device, each of the semiconductor light emitting elements 1R, 1G and 1B configuring the light emitting element panels 50R, 50G and 50B is preferably formed of the GaN-based semiconductor light emitting element 1 described in Embodiment 1, but, if necessary, the semiconductor light emitting element 1R configuring the light emitting element panel 50R may be formed of an AlInGaP-based compound semiconductor light emitting diode and the semiconductor light emitting elements 1G and 1B configuring the semiconductor light emitting element panels 50G and 50B may be formed of the GaN-based semiconductor light emitting element 1 described in Embodiment 1.

Embodiment 4

Embodiment 4 relates to an image display device which is suitably used in a method of driving a GaN-based semiconductor light emitting element in an image display device according to an embodiment of the present application. The image display device of Embodiment 4 is an image display device in which light emitting element units UN each of which includes a first light emitting element for emitting blue light, a second light emitting element for emitting green light and a third light emitting element for emitting red light and displays a color image are arranged in a two-dimensional matrix, and the basic configuration and structure of the GaN-based semiconductor light emitting element (LED) configuring at least one of the first light emitting element, the second light emitting element and the third light emitting element are equal to those of Embodiment 1, and include (A) a first GaN-based compound semiconductor layer 13 having a first conductive type (in detail, an n-type conductive type), (B) an active layer 15 having a multiple quantum well structure including well layers and a barrier layer partitioning the well layer and the well layer, and (C) a second GaN-based compound semiconductor layer 17 having a second conductive type (in detail, a p-type conductive type).

In such an image display device, any one of the first light emitting element, the second light emitting element and the third light emitting element is the GaN-based semiconductor light emitting element 1 described in Embodiment 1 and, if necessary, for example, the light emitting element for emitting red light may be formed of an AlInGaP-based compound semiconductor light emitting diode.

As the image display device of Embodiment 4, for example, there are image display devices having the following configuration and structure. In addition, the number of light emitting element units UN is determined based on the specification of the image display device.

(9) Ninth-Type and Tenth-Type Image Display Devices

A passive matrix type or active matrix type direct-view color-display image display device which displays an image by controlling the light emitting/non-light emitting states of the first light emitting element, the second light emitting element and the third light emitting element and directly viewing the light emitting states of the light emitting elements and a passive matrix type or active matrix type projection color-display image display device which displays an image by controlling the light emitting/non-light emitting states of the first light emitting element, the second light emitting element and the third light emitting element and performing projection onto a screen.

Figure 18:
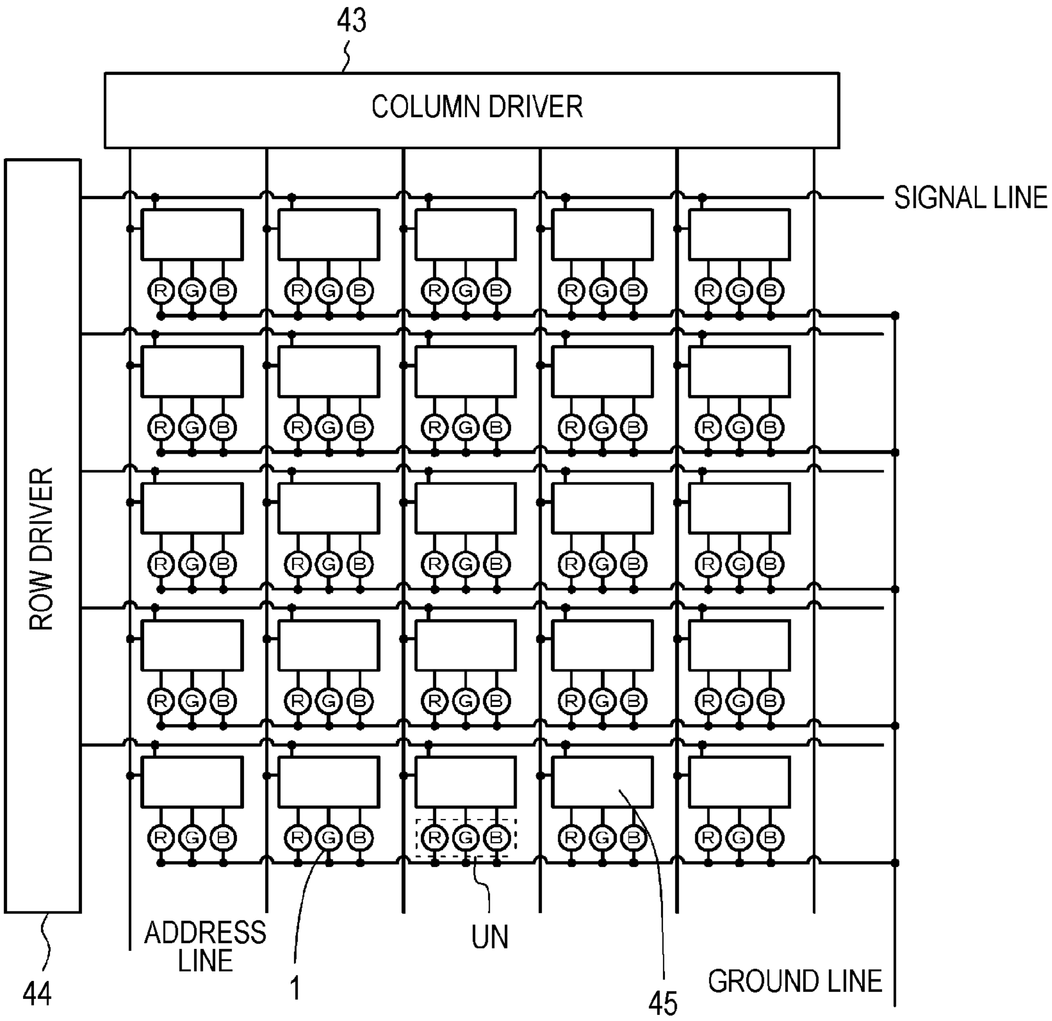
FIG. 18 is a circuit diagram of active matrix type direct-view color-display image display devices (ninth-type and tenth-type image display devices) of Embodiment 4.

For example, a circuit diagram including a light emitting element panel configuring such an active matrix type direct-view color-display image display device is shown in FIG. 18, in which one electrode (a p-side electrode or an n-side electrode) of each of the GaN-based semiconductor light emitting elements 1 (in FIG. 18, the semiconductor light emitting element for emitting red light is denoted by "R", the GaN-based semiconductor light emitting element for emitting green light is denoted by "G" and the GaN-based semiconductor light emitting element for emitting blue light is denoted by "B") is connected to a driver 45 and the driver 45 is connected to the column driver 43 and the row driver 44. In addition, the other electrode (an n-side electrode or a p-side electrode) of each of the GaN-based semiconductor light emitting elements 1 is connected to a ground line. The control of the light emitting/non-light emitting states of the GaN-based semiconductor light emitting elements 1 is, for example, performed by the driver 45 using the row driver 44, and a luminance signal for driving the GaN-based semiconductor light emitting elements 1 is supplied from the column driver 43 to the driver 45. The selection of the semiconductor light emitting element R for emitting red light, the GaN-based semiconductor light emitting element G for emitting green light and the GaN-based semiconductor light emitting element B for blue light is performed by the driver 45, the light emitting/non-light emitting states of the semiconductor light emitting element R for emitting red light, the GaN-based semiconductor light emitting element G for emitting green light and the GaN-based semiconductor light emitting element B for blue light may be time-divisionally controlled or may be controlled to simultaneously emit the lights. The lights are directly viewed in the direct-view image display device or are projected onto a screen via a projection lens in the projection image display device.

(10) Eleventh-Type Image Display Device

A field sequential type direct-view or projection color-display image display device which includes a light passing control device (for example, a liquid crystal display device) for controlling passing/non-passing of lights emitted from light emitting element units arranged in a two-dimensional matrix, time-divisionally controls the light emitting/non-light emitting states of a first light emitting element, a second light emitting element and a third light emitting element in the light emitting element units, and displays an image by controlling the passing/non-passing of the lights emitted from the first light emitting element, the second light emitting element and the third light emitting element by the light passing control device.

A conceptual diagram of such an image display device is equal to that shown in FIG. 10. The lights are directly viewed in the direct-view image display device or are projected onto a screen via a projection lens in the projection image display device.

Embodiment 5

Embodiment 5 relates to a planar light source device which is suitably used in a method of driving of a planar light source device of an embodiment of the present application and a liquid crystal display device assembly (more specially, a color liquid crystal display device assembly) including the planar light source device. The planar light source device of Embodiment 5 is a planar light source device for irradiating light to a transmissive or semi-transmissive liquid crystal display device from a rear surface thereof. The color liquid crystal display device assembly of Embodiment 5 is a transmissive or semi-transmissive color liquid crystal display device and a color liquid crystal display device assembly including a planar light source device for irradiating light to the color liquid crystal display device from a rear surface thereof.

The basic configuration and structure of the GaN-based semiconductor light emitting element (LED) as the light source included in the planar light source device are equal to those of Embodiment 1. That is, the GaN-based semiconductor light emitting element includes (A) a first GaN-based compound semiconductor layer 13 having a first conductive type (in detail, an n-type conductive type), (B) an active layer 15 having a multiple quantum well structure including well layers and a barrier layer partitioning the well layer and the well layer, and (C) a second GaN-based compound semiconductor layer 17 having a second conductive type (in detail, a p-type conductive type).

A method of driving a GaN-based semiconductor light emitting element in a method of driving a planar light source device of Embodiment 5 or Embodiment 6 which will be described below is equal to the method of driving the GaN-based semiconductor light emitting element of Embodiment 1 and thus the detailed description thereof will be described. Even when the driving current (operating current) of the GaN-based semiconductor light emitting element is increased in order to increase the luminance (brightness) of the planar light source device (backlight), the light emitting wavelength of the GaN-based semiconductor light emitting element is not shifted and thus a color reproduction range is not narrowed and changed.

Figure 19A:
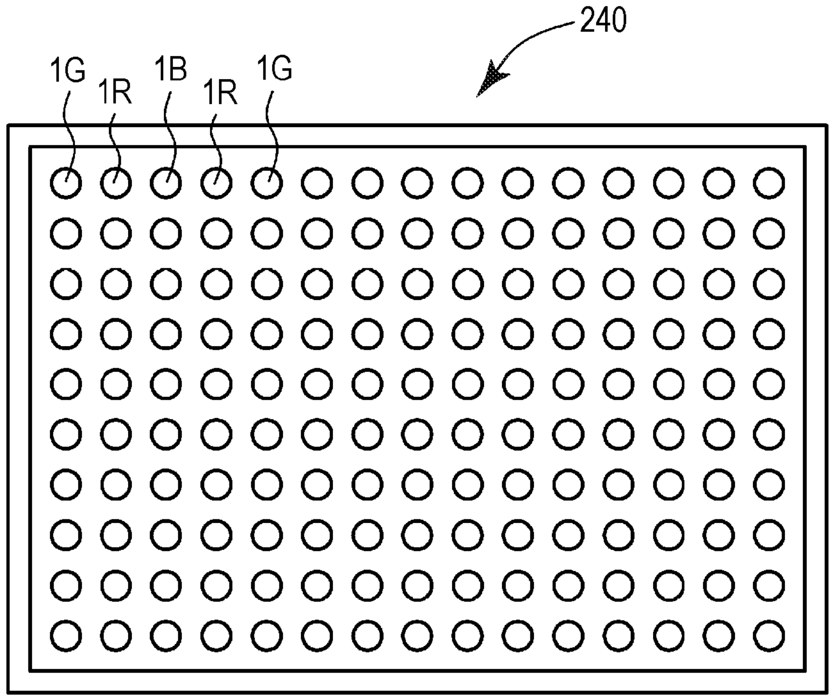
FIG. 19A is a schematic diagram of a disposition and arrangement state of a light emitting element in a planar light source device of Embodiment 5 and FIG. 19B is a schematic partial cross-sectional view of a planar light source device and a color liquid crystal display device assembly.
Figure 19B:
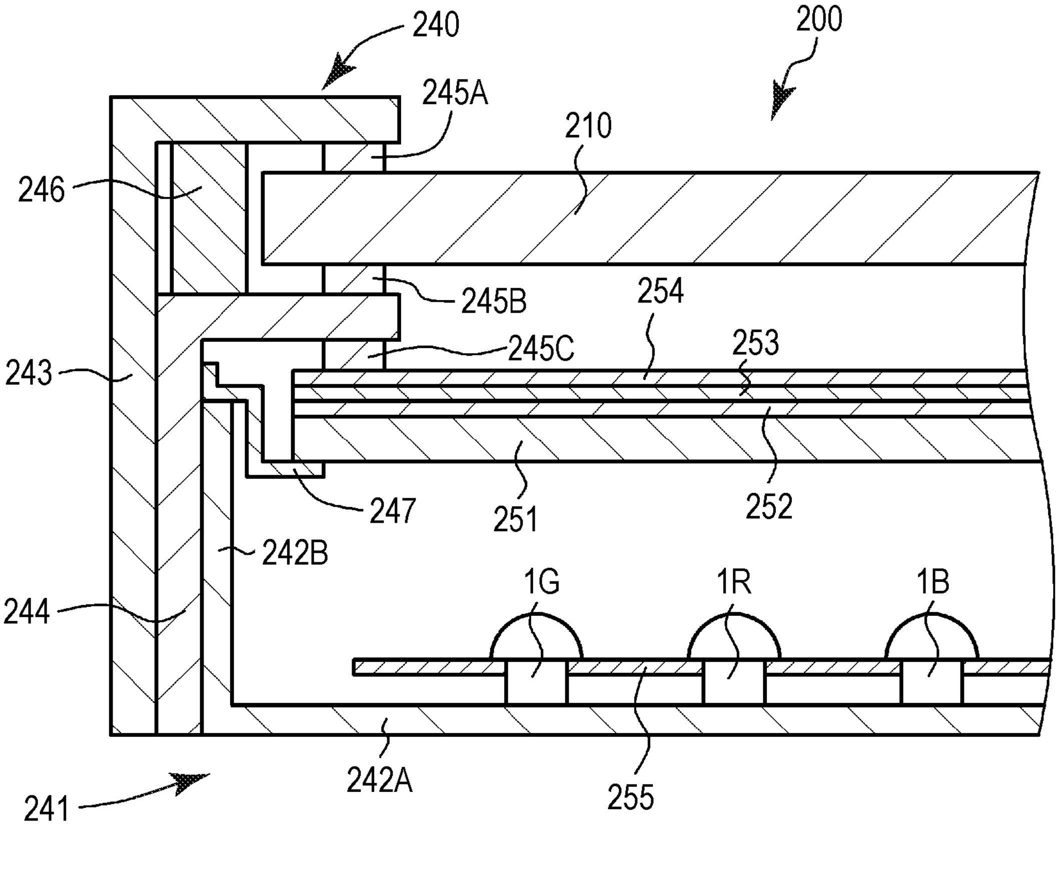
Figure 20:
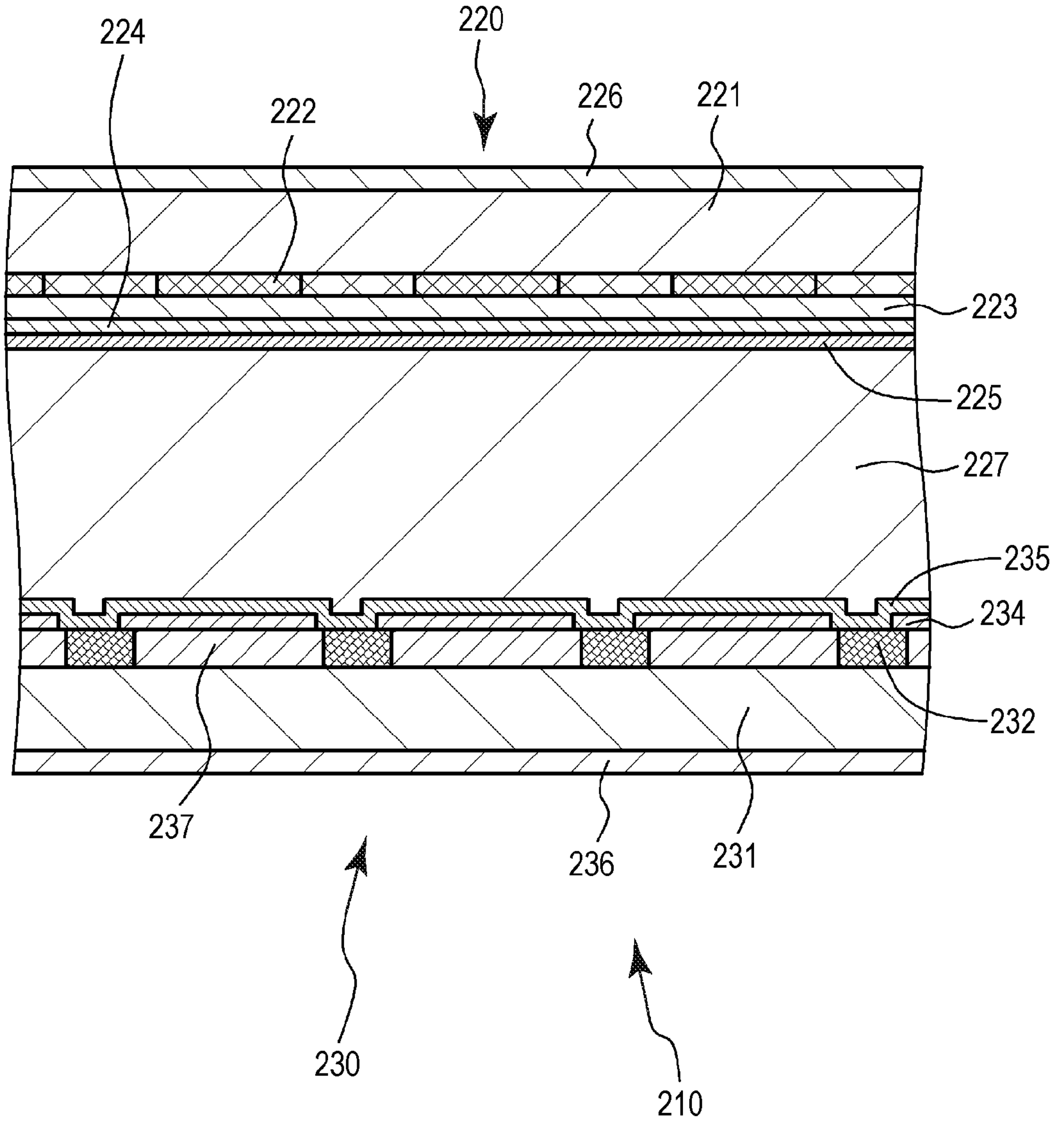
FIG. 20 is a schematic partial cross-sectional view of a color liquid crystal display device.

A disposition and arrangement state of light emitting element in a planar light source device of Embodiment 5 is schematically shown in FIG. 19A, a schematic partial cross-sectional view of a planar light source device and a color liquid crystal display device assembly is shown in FIG. 19B, and a schematic partial cross-sectional view of a color liquid crystal display device is shown in FIG. 20.

A color liquid crystal display device assembly 200 of Embodiment 5 includes, more specially, a transmissive color liquid crystal display device 210 including (a) a front panel 220 including a first transparent electrode 224, (b) a rear panel 230 including a second transparent electrode 234 and (c) a liquid crystal material 227 disposed between the front panel 220 and the rear panel 230, and (d) a planar light source device (downlight type backlight) 240 having semiconductor light emitting elements 1R, 1G and 1B as a light source. The planar light source device (down light type backlight) 240 is disposed to face the rear panel 230 so as to irradiate light to the color liquid crystal display device 210 from the rear panel side.

The down light type planar light source device 240 includes a casing 241 including an outer frame 243 and an inner frame 244. An end of the transmissive color liquid crystal display device 210 is held to be inserted by the outer frame 243 and the inner frame 244 with spacers 245A and 245B interposed therebetween. A guide member 246 is disposed between the outer frame 243 and the inner frame 244, and the color liquid crystal display device 210 inserted by the outer frame 243 and the inner frame 244 is not deviated. At the inside and the upper side of the casing 241, a diffusion plate 251 is mounted on the inner frame 244 with a spacer 245C and a bracket member 247 interposed therebetween. An optical function sheet group such as a diffusion sheet 252, a prism sheet 253 and a polarization conversion sheet 254 is laminated on the diffusion plate 251.

At the inside and the lower side of the casing 241, a reflection sheet 255 is included. The reflection sheet 255 is disposed such that a reflection surface thereof faces the diffusion plate 251 and is mounted on a bottom surface 242A of the casing 241 with a mounting member (not shown) interposed therebetween. The reflection sheet 255 may be composed of a silver reflection film having a structure in which a silver reflection film, a low-refractive-index film and a high-refractive-index film are sequentially laminated on a sheet base material. The reflection sheet 255 reflects the lights emitted from a plurality of AlGaInP-based semiconductor light emitting elements 1R for emitting red light, a plurality of GaN-based semiconductor light emitting elements 1G for emitting green light and a plurality of GaN-based semiconductor light emitting elements 1B for emitting blue light or light reflected by a side surface 242B of the casing 241. Therefore, the red, green and blue lights emitted from the plurality of semiconductor light emitting elements 1R, 1G and 1B are mixed so as to obtain white light with high color purity as illumination light. The illumination light passes the optical function sheet group such as the diffusion plate 251, the diffusion sheet 252, the prism sheet 253 and the polarization conversion sheet 254 so as to be irradiated to the color liquid crystal display device 210 from the rear surface thereof.

In the arrangement state of the light emitting elements, for example, a plurality of light emitting element rows each having a set of a red light emission AlGaInP-based semiconductor light emitting element 1R, a green light emission GaN-based semiconductor light emitting element 1G and a blue light emission GaN-based semiconductor light emitting element 1B may be arranged in a horizontal direction so as to form a light emitting element row array, and a plurality of light emitting element row arrays may be arranged in a vertical direction. The number of light emitting elements configuring the light emitting element array is, for example, (two red light emission AlGaInP-based semiconductor light emitting elements, two green light emission GaN-based semiconductor light emitting elements, and one blue light emission GaN-based semiconductor light emitting element), and the red light emission AlGaInP-based semiconductor light emitting element, the green light emission GaN-based semiconductor light emitting element, the blue light emission GaN-based semiconductor light emitting element, the green light emission GaN-based semiconductor light emitting element, and the red light emission AlGaInP-based semiconductor light emitting element are arranged in this order.

As shown in FIG. 20, the front panel 220 configuring the color liquid crystal display device 210 includes, for example, a first substrate 221 formed of a glass substrate and a polarization film 226 provided on an outer surface of the first substrate 221. A color filter 222 covered by an overcoat layer 223 formed of acrylic resin or epoxy resin is provided on an inner surface of the first substrate 221, a first transparent electrode (which is also called a common electrode and is formed of, for example ITO) 224 is provided on the overcoat layer 223, and an alignment film 225 is formed on the first transparent electrode 224. Meanwhile, the rear panel 230, more specially, for example, includes a second substrate 231 formed of a glass substrate, a switching element (more specially, a Thin Film Transistor (TFT)) 232 formed on an inner surface of the second substrate 231, a second transparent electrode (which is also a pixel electrode and is formed of, for example, ITO) 234, a conductive/non-conductive state of which is controlled by the switching element 232, and a polarization film 236 provided on an outer surface of the second substrate 231. An alignment film 235 is formed on the entire surface including the second transparent electrode 234. The front panel 220 and the rear panel 230 are adhered via a sealing material (not shown) at the peripheral portions thereof. In addition, the switching element 232 is not limited to the TFT and may be formed of, for example, an MIM element. The reference numeral 237 of the drawing is an insulating layer provided between the switching element 232 and the switching element 232.

Various members or liquid crystal materials constituting the transmissive color liquid crystal display device may be formed of known members and materials and thus the detailed description thereof will be omitted.

Each of the red light emission semiconductor light emitting elements 1R, the green light emission GaN-based semiconductor light emitting elements 1G and a blue light emission GaN-based semiconductor light emitting elements 1B has the structure shown in FIG. 2 and is connected to a driving circuit.

In addition, the planar light source device is divided into a plurality of regions and the regions are independently and dynamically controlled such that a dynamic range of the luminance of the color liquid crystal display device is widened. That is, the planar light source device is divided into a plurality of regions in every image display frame and the brightness of the planar light source device is changed according to an image signal in every region (for example, the luminance of a corresponding region of the planar light source device is proportional to a maximum luminance of the region of an image corresponding to each region) such that a corresponding region of the planar light source device is brightened in a bright region of the image and a corresponding region of the planar light source device is darkened in a dark region of the image, thereby significantly improving a contrast ratio of the color liquid crystal display device. In addition, it is possible to reduce average power consumption.

Embodiment 6

Figure 21:
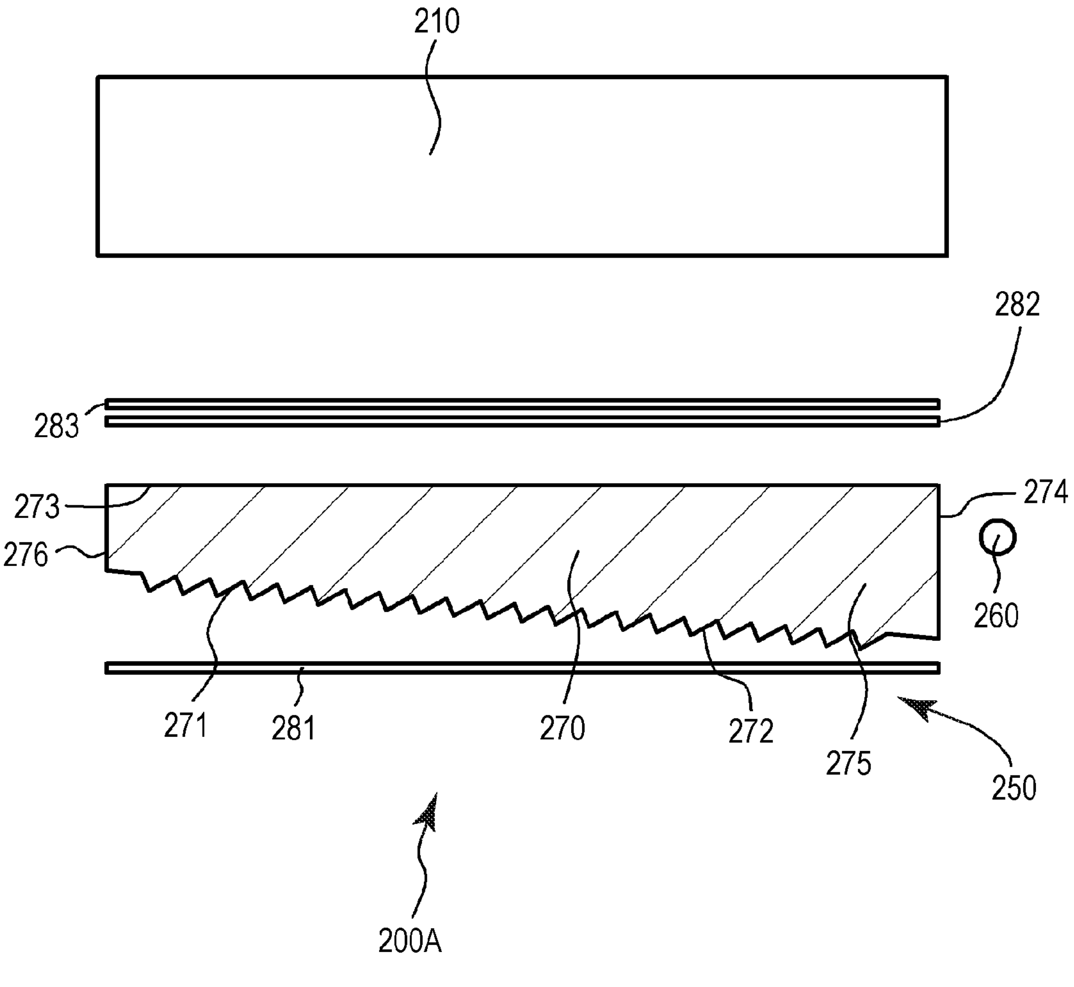
FIG. 21 is a conceptual diagram of a color liquid crystal display device assembly of Embodiment 6.

Embodiment 6 is a modified example of Embodiment 5. In Embodiment 5, the planar light source device is of a down light type. In contrast, in Embodiment 6, the planar light source device is of an edge light type. A conceptual diagram of a color liquid crystal display device assembly of Embodiment 6 is shown in FIG. 21. A schematic partial cross-sectional view of the color liquid crystal display device of Embodiment 6 is equal to the schematic partial cross-sectional view shown in FIG. 20.

A color liquid crystal display device assembly 200A of Embodiment 6 includes a transmissive color liquid crystal display device 210 including (a) a front panel 220 including a first transparent electrode 224, (b) a rear panel 230 including a second transparent electrode 234 and (c) a liquid crystal material 227 disposed between the front panel 220 and the rear panel 230, and (d) a planar light source device (edge light type backlight) 250 which includes a light guide plate 270 and a light source 260 and irradiates light to the color liquid crystal display device 210 from the rear panel side. The light guide plate 270 is disposed to face the rear panel 230.

The light source 260 includes, for example, a red light emission AlGaInP-based semiconductor light emitting element, a green light emission GaN-based semiconductor light emitting element and a blue light emission GaN-based semiconductor light emitting element. These semiconductor light emitting elements are not specially shown. The green light emission GaN-based semiconductor light emitting element and the blue light emission GaN-based semiconductor light emitting element may be equal to the GaN-based semiconductor light emitting element described in Embodiment 1. The configuration and structure of the front panel 220 and the rear panel 230 configuring the color liquid crystal display device 210 may be equal to those of the front panel 220 and the rear panel 230 of Embodiment 5 described with reference to FIG. 20 and thus the detailed description will be omitted.

For example, the light guide plate 270 formed of polycarbonate resin has a first surface (bottom surface) 271, a second surface (top surface) 273 facing the first surface 271, a first side surface 274, a second side surface 275, a third side surface 276 facing the first side surface 274, and a fourth side surface facing the second side surface 274. The more detailed shape of the light guide plate 270, there is a wedge-shaped truncated quadrangular prismatic shape as a whole. In this case, two facing side surfaces of a truncated quadrangular prism correspond to the first surface 271 and the second surface 273 and the bottom surface of the truncated quadrangular prism corresponds to the first side surface 274. Irregularities 272 are provided in the surface portion of the first surface 271. The cross-sectional shape of the continuous irregularity portion when cutting the light guide plate 270 in a virtual plane which is a light incident direction to the light guide plate 270 and is perpendicular to the first surface 271 is triangular. That is, the irregularities 272 provided in the surface portion of the first surface 271 have a prism shape. The second surface 273 of the light guide plate 270 may be smooth (that is, a mirror surface) or may have blast embossment having a diffusion effect (that is, minute irregularities). A reflection member 281 is disposed to face the first surface 271 of the light guide plate 270. The color liquid crystal display device 210 is disposed to face the second surface 273 of the light guide plate 270. In addition, a diffusion sheet 282 and a prism sheet 283 are disposed between the color liquid crystal display device 210 and the second surface 273 of the light guide plate 270. The light emitted from the light source 260 is incident from the first side surface 274 (for example, a surface corresponding to the bottom surface of the truncated quadrangular prism) of the light guide plate 270, is scattered by collision with the irregularities 272 of the first surface 271, is emitted from the first surface 271, is reflected from the reflection member 281, is incident to the first surface 271 again, is emitted from the second surface 273, and is irradiated to the color liquid crystal display device 210 through the diffusion sheet 282 and the prism sheet 283.

Although the present application is described based on the exemplary embodiments, the present application is not limited to the embodiments. The configuration and structure of the GaN-based semiconductor light emitting element described in the embodiments, the light emitting device in which the GaN-based semiconductor light emitting element, the image display device, the planar light source device, and the color liquid crystal display device assembly are exemplary and the members and materials configuring them are also exemplary, all of which may be properly modified. The lamination order of the GaN-based semiconductor light emitting element may be reversed. In the direct-view image display device, an image display device which projects an image onto the retina of a person may be used. The n-side electrode and the p-side electrode may be formed on the same side (upper side) of the GaN-based semiconductor light emitting element or the substrate 10 may be stripped and the n-side electrode and the p-side electrode may be formed on different sides of the GaN-based semiconductor light emitting element, that is, the n-side electrode may be formed on the lower side and the p-side electrode may be formed on the upper side. As the electrode, a configuration using a reflection electrode such as silver or aluminum may be employed instead of the transparent electrode or a different configuration in a long side (large diameter) or a short side (small diameter) may be employed.

Figure 22:
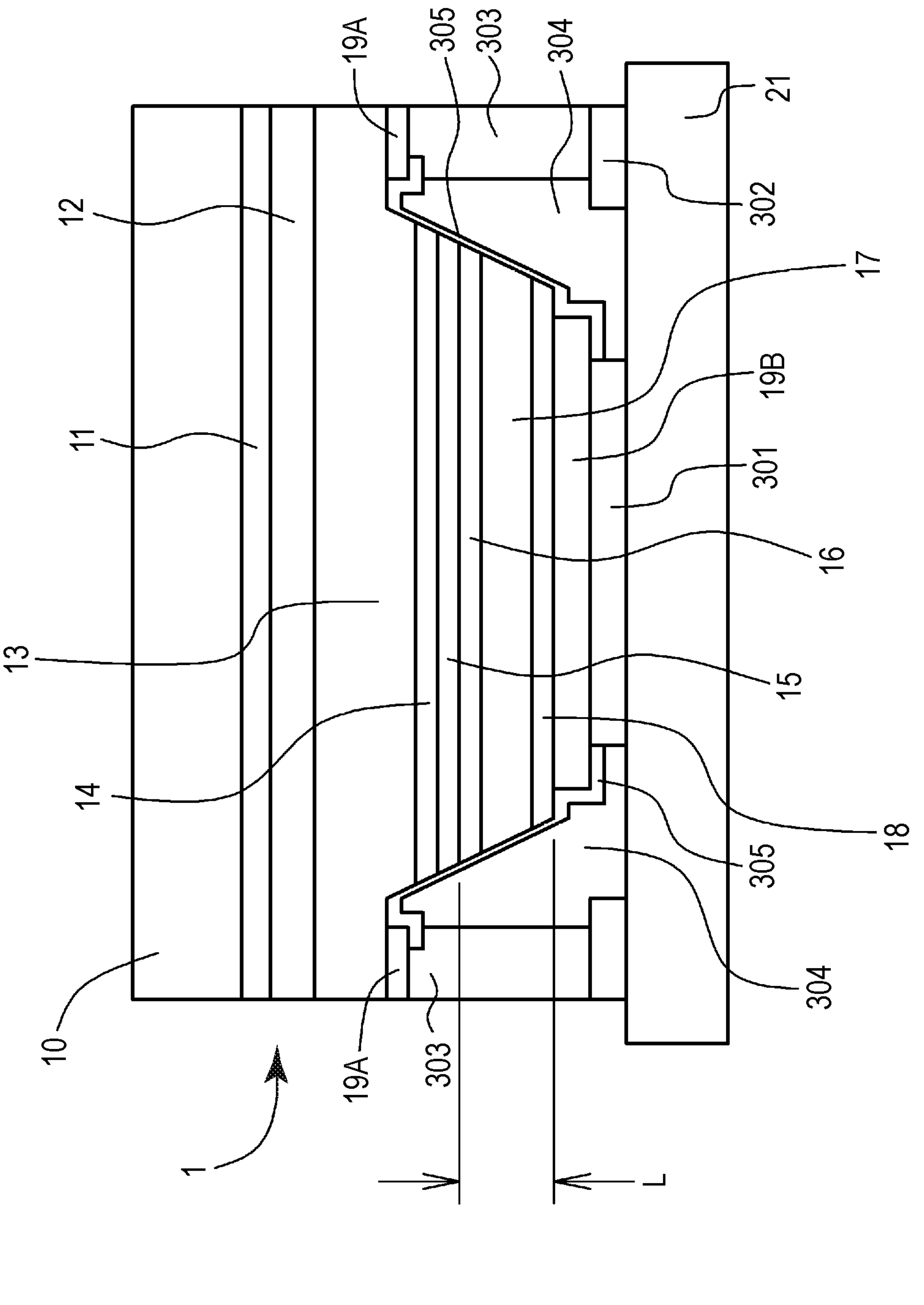
FIG. 22 is a schematic cross-sectional view of a GaN-based semiconductor light emitting element formed of an LED having a flip-chip structure.

A schematic cross-sectional view of the GaN-based semiconductor light emitting element 1 formed of an LED having a flip-chip structure is shown in FIG. 22. In FIG. 22, hatching of the components is omitted. The layer configuration of the GaN-based semiconductor light emitting element 1 may be equal to that of the GaN-based semiconductor light emitting element described in Embodiment 1. The side surfaces of the layers are covered by a passivation film 305, an n-side electrode 19A is formed on a portion of an exposed first GaN-based compound semiconductor layer 13, and a p-side electrode 19B functioning as a light reflection layer is formed on an Mg-doped GaN layer 18. The lower side of the GaN-based semiconductor light emitting element 1 is surrounded by a $SiO_2$ layer 304 and an aluminum layer 303. In addition, the p-side electrode 19B and the aluminum layer 303 are fixed to a sub mount 21 by soldering layers 301 and 302. When a distance from an active layer 15 to the p-side electrode 19B functioning as the light reflection layer is L, a refractive index of a compound semiconductor layer provided between the active layer 15 and the p-side electrode 19B is $n_0$, and a light emitting wavelength is $\lambda$, it is preferable that $0.5(\lambda/n_0) \le L \le (\lambda/n_0)$ is satisfied.

A semiconductor laser may be configured by the GaN-based semiconductor light emitting element. As the layer configuration of such a semiconductor laser, a configuration in which the following layers are sequentially formed on a GaN substrate may be exemplified. In addition, a light emitting wavelength is about 450 nm.

(1) Si-doped GaN layer (a doping concentration is $5\times10^{18}/cm^3$) having a thickness of 3 μm (2) Superlattice layer having a total thickness of 1 μm (a Si-doped $Al_{0.1}Ga_{0.9}N$ layer having a thickness of 2.4 nm and a Si-doped GaN layer having a thickness of 1.6 nm configures a set, 250 sets are laminated and a doping concentration is $5\times10^{18}/cm^3$)

(3) Si-doped $In_{0.03}Ga_{0.97}N$ layer having a thickness of 150 nm (a doping concentration is $5\times10^{18}/cm^3$)

(4) Undoped $In_{0.03}Ga_{0.97}N$ layer having a thickness of 5 nm (5) Active layer having a multiple quantum well structure (from the lower side, a well layer formed of an $In_{0.15}Ga_{0.85}N$ layer having a thickness of 3 nm/a barrier layer formed of an $In_{0.03}Ga_{0.97}N$ layer having a thickness of 15 nm/a well layer formed of an $In_{0.15}Ga_{0.85}N$ layer having a thickness of 3 nm/a barrier layer formed of an $In_{0.03}Ga_{0.97}N$ layer having a thickness of 15 nm/a well layer formed of an $In_{0.15}Ga_{0.85}N$ layer having a thickness of 3 nm/a barrier layer formed of an $In_{0.03}Ga_{0.97}N$ layer having a thickness of 15 nm/a well layer formed of an $In_{0.15}Ga_{0.85}N$ layer having a thickness of 3 nm)

(6) Undoped GaN layer having a thickness of 10 nm (7) Superlattice layer having a total thickness of 20 nm (an Mg-doped $Al_{0.2}Ga_{0.8}N$ layer having a thickness of 2.4 nm and an Mg-doped GaN layer having a thickness of 1.6 nm configures a set, 5 sets are laminated and a doping concentration is $5\times10^{19}/cm^3$)

(8) Mg-doped GaN layer having a thickness of 120 nm (a doping concentration is $1\times10^{19}/cm^3$)

(9) Superlattice layer having a total thickness of 500 nm (an Mg-doped $Al_{0.1}Ga_{0.9}N$ layer having a thickness of 2.4 nm and an Mg-doped GaN layer having a thickness 1.6 nm configures a set, 125 sets are laminated and a doping concentration is $5\times10^{19}/cm^3$)

(10) Mg-doped GaN layer having a thickness of 20 nm (a doping concentration is $1\times10^{20}/cm^3$), and

(11) Mg-doped $In_{0.15}Ga_{0.85}N$ layer having a thickness of 5 nm (a doping concentration is $1\times10^{20}/cm^3$).

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method of driving a GaN-based semiconductor light emitting element formed by laminating a first GaN-based compound semiconductor layer having a first conductive type, an active layer having a well layer, a second GaN-based compound semiconductor layer having a second conductive type, the method comprising:

starting light emission by the start of the injection of carrier; then stopping the injection of the carrier at an end of a carrier injection period, before the light emission luminance becomes constant, and before screening occurs within the active layer; and increasing the light emission luminance after stopping the injection of the carrier during a carrier rise period that is longer than the carrier injection period.

2. The method of driving a GaN-based semiconductor light emitting element according to claim 1, further comprising decreasing the light emission luminance immediately after the light emission luminance value becomes a maximum value.

3. The method of driving a GaN-based semiconductor light emitting element according to claim 1, wherein the well layer is formed of an InGaN-based compound semiconductor layer.

4. The method of driving a GaN-based semiconductor light emitting element according to claim 1, wherein the time from the start of the injection of the carrier to the stoppage of the injection of the carrier is less than 10 nanoseconds.

5. The method of driving a GaN-based semiconductor light emitting element according to claim 1, wherein the amount of the injected carrier is 10 A/$cm^2$ or more when being converted into a current amount per 1 $cm^2$ of the active layer.

6. The method of driving a GaN-based semiconductor light emitting element according to claim 1, wherein the amount of the injected carrier is 100 A/cm2 or more when being converted into a current amount per 1 $cm^2$ of the active layer.

7. The method of driving a GaN-based semiconductor light emitting element according to claim 1, wherein the amount of the injected carrier is 300 A/$cm^2$ or more when being converted into a current amount per 1 $cm^2$ of the active layer.

8. The method of driving a GaN-based semiconductor light emitting element according to claim 1, wherein a light emitting wavelength is equal to or more than 500 nm and equal to or less than 570 nm.

9. The method of driving a GaN-based semiconductor light emitting element according to claim 1, wherein the carrier injection period is 1 nanosecond or less.

10. The method of driving a GaN-based semiconductor light emitting element according to claim 1, wherein the carrier injection period is 0.5 nanosecond or less.

11. The method of driving a GaN-based semiconductor light emitting element according to claim 1, wherein the carrier injection period is about 2 picoseconds.

12. The method of driving a GaN-based semiconductor light emitting element according to claim 1, wherein the carrier rise period is about ten times as long as the carrier injection period.

13. The method of driving a GaN-based semiconductor light emitting element according to claim 1, wherein the carrier rise period is about twenty times as long as the carrier injection period.

14. The method of driving a GaN-based semiconductor light emitting element according to claim 1, wherein the carrier rise period is about 10 nanoseconds.

15. A method of driving a GaN-based semiconductor light emitting element of an image display device including the GaN-based semiconductor light emitting element for displaying an image, the GaN-based semiconductor light emitting element being formed by laminating a first GaN-based compound semiconductor layer having a first conductive type, an active layer having a well layer, a second GaN-based compound semiconductor layer having a second conductive type, the method comprising:

starting light emission by the start of the injection of carrier; then stopping the injection of the carrier at an end of a carrier injection period, before the light emission luminance becomes constant, and before screening occurs within the active layer; and increasing the light emission luminance after stopping the injection of the carrier during a carrier rise period that is longer than the carrier injection period.

16. A method of driving a planar light source device for irradiating light to a transmissive or semi-transmissive liquid crystal display device from a rear surface, a GaN-based semiconductor light emitting element as a light source included in the planar light source device being formed by laminating a first GaN-based compound semiconductor layer having a first conductive type, an active layer having a well layer, a second GaN-based compound semiconductor layer having a second conductive type, the method comprising:

starting light emission by the start of the injection of carrier; then stopping the injection of the carrier at an end of a carrier injection period, before the light emission luminance becomes constant, and before screening occurs within the active layer; and increasing the light emission luminance after stopping the injection of the carrier during a carrier rise period that is longer than the carrier injection period.

17. A method of driving a light emitting device including a GaN-based semiconductor light emitting element and a color conversion material which receives light emitted from the GaN-based semiconductor light emitting element and emits light with a wavelength different from a wavelength of the light emitted from the GaN-based semiconductor light emitting element, the GaN-based semiconductor light emitting element being formed by laminating a first GaN-based compound semiconductor layer having a first conductive type, an active layer having a well layer, a second GaN-based compound semiconductor layer having a second conductive type, the method comprising:

starting light emission by the start of the injection of carrier; then stopping the injection of the carrier at an end of a carrier injection period, before the light emission luminance becomes constant, and before screening occurs within the active layer; and increasing the light emission luminance after stopping the injection of the carrier during a carrier rise period that is longer than the carrier injection period.

* * * * *